(12) United States Patent
Kasama et al.

(10) Patent No.: US 9,293,721 B2
(45) Date of Patent: Mar. 22, 2016

(54) HOLE BLOCKING LAYER AND METHOD FOR PRODUCING SAME, AND PHOTOELECTRIC CONVERSION ELEMENT COMPRISING THE HOLE BLOCKING LAYER AND METHOD FOR MANUFACTURING SAME

(75) Inventors: Yasuhiko Kasama, Sendai (JP); Kenji Omote, Sendai (JP); Morihiko Saida, Sendai (JP); Haruna Oizumi, Sendai (JP); Hiroyuki Sagami, Sendai (JP); Kuniyoshi Yokoo, Sendai (JP); Takashi Saita, Sendai (JP); Kohshin Takahashi, Kanazawa (JP); Takayuki Kuwabara, Kanazawa (JP)

(73) Assignee: Ideal Star Inc., Sendai (JP)

( * ) Notice: Subject to any disclaimer, the term of this patent is extended or adjusted under 35 U.S.C. 154(b) by 932 days.

(21) Appl. No.: 13/389,838

(22) PCT Filed: Aug. 11, 2010

(86) PCT No.: PCT/JP2010/063600
§ 371 (c)(1),
(2), (4) Date: Apr. 30, 2012

(87) PCT Pub. No.: WO2011/019044
PCT Pub. Date: Feb. 17, 2011

(65) Prior Publication Data
US 2012/0211730 A1 Aug. 23, 2012

(30) Foreign Application Priority Data

Aug. 11, 2009 (JP) .................... 2009-186712

(51) Int. Cl.
*H01L 51/54* (2006.01)
*H01L 51/44* (2006.01)
*H01L 51/48* (2006.01)
*H01L 51/56* (2006.01)
*H01L 51/42* (2006.01)
*B82Y 10/00* (2011.01)
*H01L 51/50* (2006.01)
*H01L 51/00* (2006.01)

(52) U.S. Cl.
CPC ............ *H01L 51/4253* (2013.01); *B82Y 10/00* (2013.01); *H01L 51/4273* (2013.01); *H01L 51/5096* (2013.01); *H01L 51/0036* (2013.01); *H01L 51/0037* (2013.01); *H01L 51/0047* (2013.01); *H01L 2251/306* (2013.01); *Y02E 10/549* (2013.01); *Y02P 70/521* (2015.11)

(58) Field of Classification Search
None
See application file for complete search history.

(56) References Cited

U.S. PATENT DOCUMENTS

2002/0000532 A1* 1/2002 Takahashi et al. ............. 252/1

FOREIGN PATENT DOCUMENTS

| JP | 2004319705 A | 11/2004 |
|---|---|---|
| JP | 200863173 A | 3/2008 |
| JP | 2009146981 A | 7/2009 |
| WO | WO 2006070186 A1 * | 7/2006 |
| WO | 2007079498 A2 | 7/2007 |

OTHER PUBLICATIONS

Machine translation of JP2009-146981. Date of publication: Jul. 2, 2009.*
Glatthaar et al., Organic Solar Cells Using Inverted Layer Sequence, Thin Solid Films, 2005, pp. 298-300, vol. 491.
Agafonov et al., Sol-Gel Synthesis, Preparation and Characterization of Photoactive TIO2 with Ultrasound Treatment, J. Sol-Gel Sci Technol, 2009, pp. 180-185, vol. 49.
Jin Young Kim et al., "Efficient Tandem Polymer Solar Cells Fabricated by All-Solution Processing", Science, Jul. 13, 2007, pp. 222-225, vol. 317.
Wanli Ma et al, "Thermally Stable, Efficient Polymer Solar Cells with Nanoscale Control of the Interpenetrating Network Morphology", Advanced Functional Materials, 2005, pp. 1617-1622, vol. 15.

* cited by examiner

*Primary Examiner* — Andrew K Bohaty
(74) *Attorney, Agent, or Firm* — The Webb Law Firm

(57) ABSTRACT

Provided is a hole-blocking layer which has excellent basic characteristics such as high photoelectric conversion efficiency, while exhibiting excellent productivity. The hole-blocking layer is produced by a process that has a step of bringing an aqueous solution containing hydrogen peroxide and titanium (IV) oxysulfate into contact with the surface of a member on which the hole-blocking layer is to be formed, and holding the contact between the aqueous solution and the member at 50 to 120° C., so that an amorphous titanium oxide precursor precipitates on the surface of the member; and a step of drying the amorphous titanium oxide precursor that has precipitated on the member.

22 Claims, 4 Drawing Sheets

HOLE BLOCKING LAYER AND METHOD FOR PRODUCING SAME, AND PHOTOELECTRIC CONVERSION ELEMENT COMPRISING THE HOLE BLOCKING LAYER AND METHOD FOR MANUFACTURING SAME

TECHNICAL FIELD

The present invention relates to a hole-blocking layer that is disposed between an organic semiconductor layer and an electrode, and that suppresses electrical conduction between the organic semiconductor layer and the electrode from being carried by holes, and to a method for producing the hole-blocking layer, as well as to a photoelectric conversion element such as an organic thin-film solar cell and an organic EL element, that is provided with the hole-blocking layer.

BACKGROUND ART

Silicon-based solar cells, which are currently the dominant solar cell type, exhibit high photoelectric conversion efficiency, but incur significant environmental impact in terms of resources, carbon dioxide emissions during production, and cost. Therefore, research is being conducted, on a global scale, on solar cells that are clean, and have fewer resource constraints, in the form of photoelectric conversion elements that use organic semiconductor materials, in particular on so-called organic thin-film solar cells having a structure such that an organic semiconductor is sandwiched between electrodes that have dissimilar work functions.

In 2005, Heeger et al. produced an ITO/PEDOT:PSS/P3HT:PCBM blend film/Al-type cell (hereafter also referred to as "normal-type solar cell"), which attained a photoelectric conversion efficiency of 5% (Non-Patent Document 1).

Herein, "ITO" denotes indium tin oxide; and "PEDOT:PSS" denotes a polymer compound comprising poly-3,4-ethylenedioxythiophene (PEDOT) and polystyrene sulfonate (PSS), having the structure below.

[C1]

Further, "P3HT:PCBM blend film" denotes a filmy body comprising a mixture of poly-3-hexylthiophene (P3HT) and [6,6]-phenyl-$C_{61}$-butyric acid methyl ester (PCBM), wherein the constituent substances have the respective structures below.

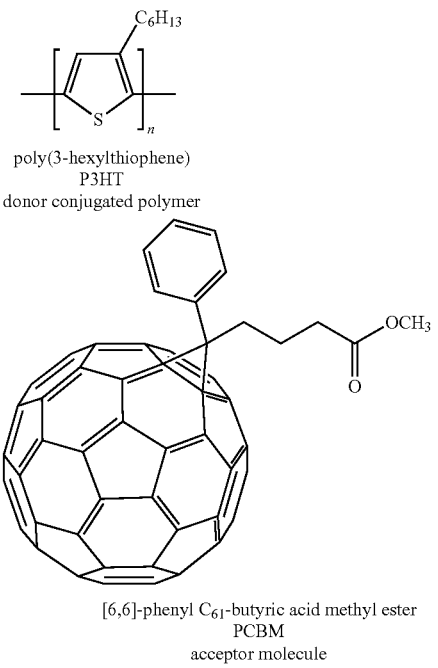

poly(3-hexylthiophene)
P3HT
donor conjugated polymer

[6,6]-phenyl $C_{61}$-butyric acid methyl ester
PCBM
acceptor molecule

[C2]

The highest value of photoelectric conversion efficiency of organic thin-film solar cells currently reported is of 6.5% for a tandem-type cell, produced by Heeger et al. in 2007, using a P3HT:$PC_{70}$BM blend film and a PCPDTBT:PCBM blend film (Non-Patent Document 2).

Efficient transportation, to the respective electrodes, of the positive and negative carriers that are generated in the organic semiconductor as a result of light irradiation is a particularly important issue in organic thin-film solar cells in terms of enhancing the performance of the organic thin-film solar cell as a photoelectric conversion element.

In the above-described normal-type solar cell it is expected that hole-transport efficiency is enhanced by a hole-transport layer that comprises PEDOT:PSS.

The inventors have proposed techniques wherein an oxide semiconductor functioning as a hole-blocking layer is interposed between an anode electrode and an organic semiconductor layer from the viewpoint of enhancing electron transport efficiency (for instance, Patent Documents 1 and 2). As disclosed in Patent Document 2, energy conversion efficiency ($\eta$) is enhanced by interposing an oxide semiconductor layer (hole-blocking layer), comprising amorphous titanium oxide, between an ITO electrode and an organic semiconductor layer comprising a P3HT:PCBM blend film.

Patent Document 1: JP 2004-319705 A
Patent Document 2: JP 2009-146981 A
Non-Patent Document 1: Wanli Ma, Cuiying Yang, Xiong Gong, Kwaghee Lee, Alan J. Heeger, Adv. Funct. Mater. 15, 1617-1622 (2005)
Non-Patent Document 2: Jin Young Kim, Kwanhee Lee, Nelson E. Coates, Daniel Moses, Thuc-Quyen Nguyen, Mark Dante, Alan J. Heeger, Science, 317, 222-225 (2007)

DISCLOSURE OF THE INVENTION

The characteristics of an organic thin-film solar cell-type photoelectric conversion element can be thus enhanced by interposing, between an electrode and an organic semicon-

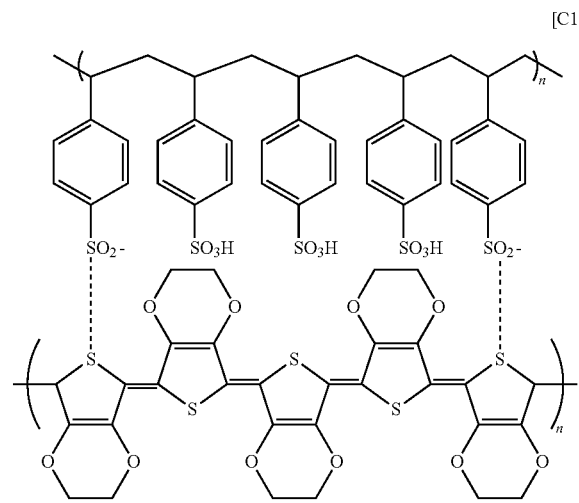

ductor, an interlayer that increases carrier transport efficiency. However, further improvements in the composition and structure of such an interlayer are required.

In order to secure an advantage vis-à-vis photoelectric conversion elements having other structures, not only must photoelectric conversion efficiency be increased, but also the element must exhibit high productivity and quality stability. However, the development of organic thin-film solar cell-type photoelectric conversion elements has focused thus far only on enhancing photoelectric conversion efficiency, with no emphasis on technical developments from the viewpoint of productivity.

In the light of the above, it is an object of the present invention to provide a hole-blocking layer that has excellent basic characteristics such as high photoelectric conversion efficiency as well as excellent productivity, and to provide a method for producing the hole-blocking layer, and to provide as well a photoelectric conversion element, such as an organic thin-film solar cell and organic EL element, comprising the hole-blocking layer, and a method for producing the photoelectric conversion element.

The present invention, provided in order to solve the above problems, is as follows:

(1) A hole-blocking layer disposed between an organic semiconductor layer and an electrode electrically connected to the organic semiconductor in an element comprising the organic semiconductor layer and the electrode, the hole-blocking layer suppressing electrical conduction between the organic semiconductor layer and the electrode from being carried by holes, wherein the hole-blocking layer is produced by a process that has a step of bringing an aqueous solution containing hydrogen peroxide and titanium (IV) oxysulfate into contact with the surface of a member on which the hole-blocking layer is to be formed, and holding the contact between the aqueous solution and the surface of the member at 50 to 120° C., so that an amorphous titanium oxide precursor precipitates on the surface of the member; and a step of drying the amorphous titanium oxide precursor that has precipitated on the surface of the member.

(2) The hole-blocking layer according to above-described (1), wherein the aqueous solution contains 0.005 mol/L to 1 mol/L of the titanium (IV) oxysulfate and 0.005 mol/L to 1 mol/L of the hydrogen peroxide.

(3) The hole-blocking layer according to above-described (1) or (2), wherein the hole-blocking layer has a surface roughness (Ra) equal to or smaller than a surface roughness of the member on which the hole-blocking layer is to be formed.

(4) A hole-blocking layer disposed between an organic semiconductor layer and an electrode electrically connected to the organic semiconductor in an element comprising the organic semiconductor layer and the electrode, the hole-blocking layer suppressing electrical conduction between the organic semiconductor layer and the electrode from being carried by holes, wherein the hole-blocking layer is produced by a process that has a step of bringing a nonaqueous solution containing a lower alkylamine and an organic titanium compound represented by formula (i) below, into contact with the surface of a member on which the hole-blocking layer is to be formed, to thereby form a liquid layer of the nonaqueous solution on the surface; a step of hydrolyzing the organic titanium compound included in the liquid layer of the nonaqueous solution, to thereby form a hydrolysis product of the organic titanium compound in the liquid layer of the nonaqueous solution; and a step of drying the liquid layer of the nonaqueous solution containing the hydrolysis product of the organic titanium compound:

$$Ti(OR^1)_4 \quad (i)$$

wherein $R^1$ denotes identical or different substituents selected from the group consisting of alkyl groups having from 1 to 8 carbon atoms, cycloalkyl groups, and aryl groups, as well as hydroxy, alkoxy, amino, and fluoro derivatives thereof.

(5) The hole-blocking layer according to above-described (4), wherein the molar ratio of the organic titanium compound with respect to the lower alkylamine in the nonaqueous solution for forming the hole-blocking layer (the organic titanium compound/lower alkylamine) ranges from 0.25 to 1.

(6) The hole-blocking layer according to above-described (4) or (5), wherein the lower alkylamine is diethylamine, and a drying temperature in the step of drying the nonaqueous solution located on the member and containing the hydrolysis product of the organic titanium compound is not higher than 100° C.

(7) A photoelectric conversion element, comprising a stack in which there are disposed a first collector electrode layer, the hole-blocking layer described in any one of above-described (1) to (6), an organic semiconductor layer, and a second collector electrode layer in this order, wherein at least one of the first collector electrode layer and the second collector electrode layer has light transmissivity.

(8) The photoelectric conversion element according to above-described (7), wherein the thickness of the hole-blocking layer ranges from 5 nm to 200 nm.

(9) The photoelectric conversion element according to above-described (7) or (8), wherein a hole-transport layer that promotes charge transfer between the organic semiconductor layer and the second collector electrode layer being carried by holes is provided between the organic semiconductor layer and the second collector electrode layer.

(10) The photoelectric conversion element according to above-described (9), wherein the organic semiconductor layer includes a conjugated polymer as an electron donor and a fullerene derivative as an electron acceptor, and the hole-transport layer is produced by a process that has a step of bringing a surface of the organic semiconductor layer included in a member resulting from stacking the first collector electrode layer, the hole-blocking layer, and the organic semiconductor layer, into contact with an aqueous dispersion containing poly-3,4-ethylenedioxythiophene (PEDOT) and polystyrene sulfonate (PSS), and a nonionic surfactant.

(11) The photoelectric conversion element according to above-described (10), wherein the nonionic surfactant is represented by formula (ii) below:

$$R(OCH_2CH_2)_nOH \quad (ii)$$

wherein R denotes an alkyl group having from 10 to 15 carbon atoms, and n is an integer ranging from 5 to 15.

(12) An organic thin-film solar cell panel, comprising, a light-transmitting substrate; the photoelectric conversion element described in any one of above-described (7) to (11) provided on the light-transmitting substrate in such a manner that the first or second collector electrode layer having light transmissivity is in contact with the light-transmitting substrate; and a chassis that seals the photoelectric conversion element.

(13) A light-emitting device, comprising the photoelectric conversion element described in any one of above-described (7) to (11), as a light-emitting element.

(14) A method for producing a hole-blocking layer disposed between an organic semiconductor layer and an electrode electrically connected to the organic semiconductor in an element comprising the organic semiconductor layer and the electrode, the hole-blocking layer suppressing electrical conduction between the organic semiconductor layer and the electrode from being carried by holes, the method comprising, a step of bringing an aqueous solution containing hydrogen peroxide and titanium (IV) oxysulfate into contact with the surface of a member on which the hole-blocking layer is to be formed, and holding the contact between the aqueous solution and the surface of the member at 50 to 120° C., so that an amorphous titanium oxide precursor precipitates on the surface of the member; and a step of drying the amorphous titanium oxide precursor that has precipitated on the member.

(15) The method according to above-described (14), wherein the aqueous solution contains 0.005 mol/L to 1 mol/L of the titanium (IV) oxysulfate and 0.005 mol/L to 1 mol/L of the hydrogen peroxide.

(16) The method according to above-described (14) or (15), wherein the hole-blocking layer has a surface roughness (Ra) equal to or smaller than a surface roughness of the member on which the hole-blocking layer is to be formed.

(17) A method for producing a hole-blocking layer disposed between an organic semiconductor layer and an electrode electrically connected to the organic semiconductor in an element comprising the organic semiconductor layer and the electrode, the hole-blocking layer suppressing electrical conduction between the organic semiconductor layer and the electrode from being carried by holes, the method comprising, a step of bringing an nonaqueous solution containing a lower alkylamine and an organic titanium compound represented by formula (i) below, into contact with the surface of a member on which the hole-blocking layer is to be formed, to thereby form a liquid layer of the nonaqueous solution on the surface; a step of hydrolyzing the organic titanium compound included in the liquid layer of the nonaqueous solution, to thereby form a hydrolysis product of the organic titanium compound in the liquid layer of the nonaqueous solution; and a step of drying the liquid layer of the nonaqueous solution containing the hydrolysis product of the organic titanium compound:

$$\text{Ti}(\text{OR}^1)_4 \qquad (i)$$

wherein $R^1$ denotes identical or different substituents selected from the group consisting of alkyl groups having from 1 to 8 carbon atoms, cycloalkyl groups, and aryl groups, as well as hydroxy, alkoxy, amino, and fluoro derivatives thereof.

(18) The method according to above-described (17), wherein the molar ratio of the organic titanium compound with respect to the lower alkylamine in the nonaqueous solution for forming the hole-blocking layer (the organic titanium compound/lower alkylamine) ranges from 0.25 to 1

(19) The method according to above-described (17) or (18), wherein the lower alkylamine is diethylamine, and a drying temperature in the step of drying the nonaqueous solution located on the member and containing the hydrolysis product of the organic titanium compound is not higher than 100° C.

(20) A method for producing a photoelectric conversion element comprising a stack in which there are disposed a first collector electrode layer, an oxide semiconductor layer, an organic semiconductor layer, a hole-transport layer, and a second collector electrode layer in this order, wherein at least one of the first collector electrode layer and the second collector electrode layer has light transmissivity, the oxide semiconductor layer comprises a hole-blocking layer produced in accordance with the production method described in any one of above-described (14) to (19), the organic semiconductor layer includes a conjugated polymer as an electron donor and a fullerene derivative as an electron acceptor, and the hole-transport layer is produced by a process that has a step of bringing a surface of the organic semiconductor layer included in a member resulting from stacking the first collector electrode layer, the oxide semiconductor layer, and the organic semiconductor layer, into contact with an aqueous dispersion containing poly-3,4-ethylenedioxythiophene (PEDOT) and polystyrene sulfonate (PSS), and a nonionic surfactant.

(21) The method according to above-described (20), wherein the nonionic surfactant is represented by formula (ii) below:

$$R(OCH_2CH_2)_nOH \qquad (ii)$$

wherein R denotes an alkyl group having from 10 to 15 carbon atoms, and n is an integer ranging from 5 to 15.

The hole-blocking layer of the present invention has excellent hole-blocking ability and light transmissivity. Therefore, a photoelectric conversion element comprising this hole-blocking layer has higher initial photoelectric conversion efficiency as compared with conventional photoelectric conversion elements. In a case where the photoelectric conversion element comprising the hole-blocking layer of the present invention is a solar cell, the solar cell exhibits excellent durability and is little prone to lose photoelectric conversion efficiency even under continued irradiation of light. Moreover, no special atmosphere control is necessary during the production of the hole-blocking layer, and no electrolysis equipment or cooling equipment is required. Also, the surface area per batch can be increased, and production made continuous, which translates into superior productivity.

Therefore, the present invention allows obtaining a photoelectric conversion element that has high photoelectric conversion efficiency and that exhibits high productivity and high quality stability. An organic solar cell panel or light-emitting device obtained by using such a photoelectric conversion element is likewise excellent in quality and economy.

BEST MODE FOR CARRYING OUT THE INVENTION

Figure 1:
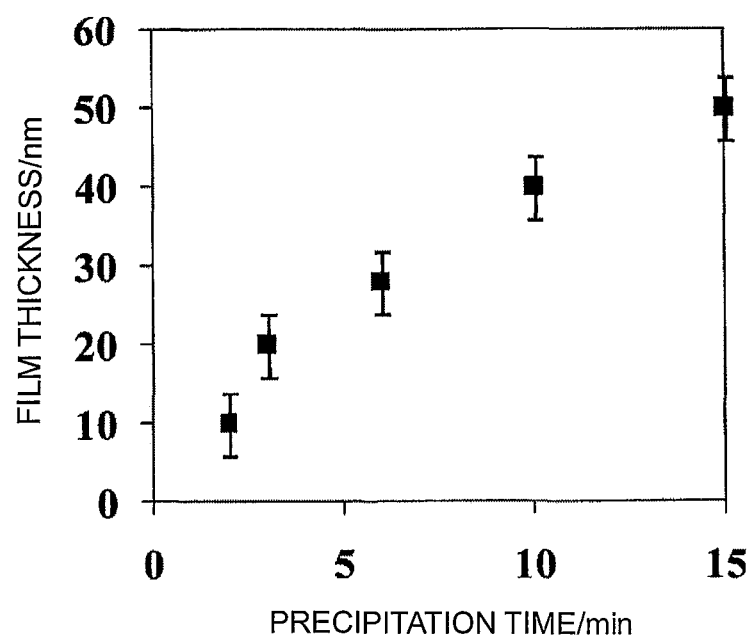
FIG. 1 is a graph illustrating the relationship between film thickness and precipitation time in a hole-blocking layer comprising amorphous titanium oxide according to the present invention.

A detailed explanation follows next on a photoelectric conversion element, and production method thereof, according to the present invention, and on an organic thin-film solar cell panel that uses such a photoelectric conversion element.

I. First Embodiment

1. Hole-Blocking Layer

In the present invention, the hole-blocking layer denotes a layer that is disposed between an organic semiconductor layer and an electrode in an element that comprises the organic semiconductor layer and the electrode electrically connected to the organic semiconductor layer, and that suppresses electrical conduction between the organic semiconductor layer and the electrode from being carried by holes. The characteristic of suppressing the passage of holes, elicited by the hole-blocking layer, is referred to as hole-blocking ability.

The hole-blocking layer according to the present invention comprises substantially amorphous titanium oxide. Herein, "amorphous titanium oxide" denotes titanium oxide that contains also titanium oxide having an atomic ratio between oxygen and titanium other than the stoichiometric ratio (titanium:oxygen=1:2), and that has a structure lacking long-range order (over several hundred to several thousand atoms), even though the structure may have short-range order (over several atoms to several tens of atoms). Thereafter, the hole-blocking layer according to the present invention comprising substantially amorphous titanium oxide will be referred to as "amorphous titanium oxide layer". The term "substantially" indicates that the hole-blocking layer according to the present invention may contain, other than amorphous titanium oxide, also some amount of water or the like incurred during production.

The amorphous titanium oxide layer according to the present invention has excellent hole-blocking ability. Due to such hole-blocking layer, charge transport between an electrode and an organic semiconductor layer takes place preferentially by way of electrons, and hence migration of holes between the electrodes and the organic semiconductor layer is suppressed efficiently. If the photoelectric conversion element provided with such a hole-blocking layer is a solar cell, therefore, electrons generated in the organic semiconductor layer as a result of irradiation of light can efficiently reach an electrode. If the photoelectric conversion element is a light-emitting element such as an organic EL element, electrons injected from an electron-injection electrode can be efficiently injected into the organic semiconductor layer that makes up a light-emitting layer. Therefore, the photoelectric conversion efficiency of the photoelectric conversion element provided with such an amorphous titanium oxide layer is high, both upon light irradiation and upon charge injection.

An instance where the photoelectric conversion element is an organic thin-film solar cell will be explained in detail further on. Therefore, an explanation follows next on an instance where the photoelectric conversion element is an organic EL element.

The organic EL element has a basic structure wherein an organic light-emitting layer (i.e. organic semiconductor layer) comprising an organic semiconductor is interposed between an electron-injection electrode and a hole-injection electrode. Upon application of voltage across both ends of the element, electrons are injected to the organic light-emitting layer from the electron-injection electrode, and holes are injected to the organic light-emitting layer from the hole-injection electrode. The injected electrons and holes recombine in the organic light-emitting layer, giving rise to a luminous phenomenon.

In a case where, in the organic light-emitting layer, hole injection from the hole-injection electrode is predominant over electron injection from the electron-injection electrode, then current flows mainly as a result of the movement of holes that preferentially pass through the organic light-emitting layer. As a result, emission fails to take place, or the luminous efficiency is very low.

Therefore, inserting the hole-blocking layer according to the present invention between the electron-injection electrode (electrode) and the organic light-emitting layer (organic semiconductor layer) causes the passage of holes to be hindered by the hole-blocking layer, and promotes electron injection from the electron injection layer into the organic light-emitting layer. Also, holes accumulate at the interface between the hole-blocking layer and the organic light-emitting layer, on the side of the organic light-emitting layer. As a result, this increases the probability of recombination, in the vicinity of the interface, between the blocked holes and electrons that are injected into the hole-blocking layer from the electron-injection electrode. Luminous efficiency is expected to be further enhanced as a result.

As explained above, the function of the organic EL element can be enhanced by using the form of the amorphous titanium oxide layer according to the present invention as a hole-blocking layer.

The amorphous titanium oxide layer used as the hole-blocking layer according to the present invention has excellent light transmissivity. Therefore, the amorphous titanium oxide layer does not readily hamper photoelectric conversion reactions in the organic semiconductor layer, even when disposed between the organic semiconductor layer and an electrode that is provided on the side of a light-irradiation surface or a light-emission surface. From this viewpoint as well, a photoelectric conversion element provided with the hole-blocking layer according to the present invention has excellent light conversion efficiency.

The amorphous titanium oxide layer may contain other materials, provided that the hole-blocking ability of the hole-blocking layer is elicited predominantly by the amorphous titanium oxide. For instance, the amorphous titanium oxide layer may contain a dopant for enhancing electron transport efficiency.

In the present invention, the amorphous titanium oxide layer is produced according to a production method that comprises the following precipitation and drying steps.

i) Precipitation Step

An aqueous solution (hereafter, "aqueous solution" for short) containing hydrogen peroxide and titanium (IV) oxysulfate is brought into contact with the surface of a member (hereafter, "base material" for short) on which the hole-blocking layer is to be formed; and the contact between the aqueous solution and the base material is held, at 50 to 120° C., so as to cause an amorphous titanium oxide precursor to precipitate on the surface of the base material.

The element that constitutes the surface of the base material on which the hole-blocking layer is to be formed may be an electrode, or an organic semiconductor layer, and may be appropriately set when designing the production method of the whole photoelectric conversion element that is provided with the hole-blocking layer. In terms of chemical stability, the element is preferably an electrode. In a case where the hole-blocking layer is formed on the organic semiconductor layer, a surfactant is preferably added to the aqueous solution in order to enhance wettability between the aqueous solution and a layer comprising an organic material.

Reactions represented by reaction formula (1) and reaction formula (2) below are deemed to take place in the above-described aqueous solution.

$$TiO^{2+}+H_2O_2 \rightarrow Ti(O_2)^{2+}+H_2O \qquad (1)$$

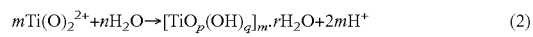

$$mTi(O)_2{}^{2+}+nH_2O \rightarrow [TiO_p(OH)_q]_m \cdot rH_2O+2mH^+ \qquad (2)$$

Herein, m, n, p, q, r as well as the below-mentioned s and x, are unknown numerical values. Herein, $[TiO_p(OH)_q]_m \cdot rH_2O$ (this chemical substance is referred to as "amorphous titanium oxide precursor" in the present invention) that precipitates on the surface of the base material is dried, to elicit thereby a dehydration reaction represented by reaction formula (3) below, and to cause an amorphous titanium oxide layer to be formed on the surface of the base material. In the formula below, $TiO_x$ denotes amorphous titanium oxide.

$$[TiO_p(OH)_q]_m \cdot rH_2O \rightarrow mTiO_x + sH_2O \qquad (3)$$

Thus, water is involved in the reaction by which the amorphous titanium oxide precursor precipitates. As a result, the above-described reaction can take place in an ordinary atmosphere. In a case where the amorphous titanium oxide layer is formed by a sol-gel method, such as the one disclosed in Patent Document 2, by contrast, equipment such as a glovebox or the like is required in order to control the atmosphere, since the precursor of the amorphous titanium oxide by a sol-gel method undergoes hydrolysis very readily (unlike the amorphous titanium oxide precursor according to the present invention). Therefore, the method for producing an amorphous titanium oxide layer according to the present invention is simpler and exhibits higher productivity than conventional methods for producing amorphous titanium oxide.

Also, the above-described aqueous solution is stable at room temperature, and the reaction of reaction formula (2) virtually does not progress unless the aqueous solution is heated to about 50° C. or above. In the case of a reaction solution for electroreductive precipitation such as the one disclosed in Patent Document 2, by contrast, the reaction solution precipitates and decomposes unless cooled to about 0° C. In order to carry out the electroreductive precipitation disclosed in Patent Document 2, accordingly, cooling equipment for the reaction solution is required, in addition to equipment for electrolysis. Ordinarily, cooling equipment entails greater equipment introduction costs and greater running costs than heating equipment. From this viewpoint as well, therefore, the method for producing the amorphous titanium oxide layer according to the present invention is simpler and exhibits higher productivity than conventional methods for producing an amorphous titanium oxide layer.

By virtue of such simplicity and high productivity, the hole-blocking layer according to the present invention can cope with present and ongoingly arising challenges in production technologies of solar cells, in terms of quality stability and achieving greater surface areas. Specifically, the hole-blocking layer according to the present invention enables increasing the processing surface area per batch, and makes a production method possible such that a hole-blocking layer is continuously formed through immersion of a sheet-like base material in aqueous solution while moving the base material in the aqueous solution.

The composition of the aqueous solution is not particularly limited in terms of the lower limit of the concentration of the various components, so long as the aqueous solution contains hydrogen peroxide and titanium (IV) oxysulfate, and the amorphous titanium oxide precursor can be caused to precipitate within a realistic treatment time. If the concentration of one or both components is excessive, there arises the concern of corrosion of the element that constitutes the surface of the base material (electrode or organic semiconductor layer) and/or of the substrate that supports the element, and, in addition, there arises the concern of loss of functionality in the photoelectric conversion element on account of a decrease in the surface area of the interface with the material that makes up the organic semiconductor layer due to coarser crystal grain size, and a decrease in the effective interface due to deposition of by-products. Accordingly, the concentration of both components is preferably set to range from about 0.005 to 1 mol/L, more preferably from about 0.01 to 0.5 mol/L. In terms of combining shortening of treatment time with an improvement in the quality of the amorphous titanium oxide layer and achieving a greater degree of corrosion resistance, the component molar ratio i.e. (molar concentration of hydrogen peroxide)/(molar concentration of titanium (IV) oxysulfate) ranges preferably from about 0.1 to 10, more preferably from 1 to 10.

The contact method between the surface of the base material and the aqueous solution is not particularly limited, and any means may be used dipping, spraying, spin-coating, roll-coating, or discharge, by ink-jetting, of the liquid that makes up the aqueous solution. Holding contact while in a stationary state is advantageous in terms of stabilizing precipitation. Preferably, therefore, the base material is immersed in the aqueous solution, and is left to stand in that state.

The temperature of the aqueous solution in a condition where the contact state between the surface of the base material and the aqueous solution is held is set to 50 to 120° C. The time required for precipitation may be longer, and productivity poorer, if the temperature is excessively low. An excessively high temperature destabilizes precipitation of the amorphous titanium oxide precursor, and may detract from the quality of the amorphous titanium oxide layer on account of the influence of by-products such as decomposition products. In addition, the element (electrode or organic semiconductor layer) that constitutes the surface of the base material becomes likely to corrode, and hence the characteristics of the photoelectric conversion element may be markedly impaired. In terms of combining, to a yet higher degree, both high productivity and excellent quality, the temperature is preferably set to range from 50 to 90° C., more preferably from 60 to 90° C.

The holding time of the contact state between the surface of the base material and the aqueous solution is appropriately set in consideration of the composition of the aqueous solution, the bath temperature, and the required thickness of the amorphous titanium oxide layer. FIG. 1 is a graph illustrating the dependence of the thickness of the amorphous titanium oxide layer on the contact time with the aqueous solution, in an amorphous titanium oxide layer obtained by carrying out the contact of an aqueous solution, which is held at 80° C. and contains 0.03 mol/L of hydrogen peroxide and 0.03 mol/L of titanium (IV) oxysulfate, with a light-transmitting electrode layer comprising ITO, in order to cause an amorphous titanium oxide precursor to precipitate on the light-transmitting electrode layer, followed by a below-described drying step. As illustrated in FIG. 1, the thickness of the amorphous titanium oxide layer according to the present invention can be controlled by managing the holding time of the contact state.

The thickness of the amorphous titanium oxide layer is to be appropriately set. A thicker amorphous titanium oxide layer translates into greater hole-blocking ability, but tends to slightly impair light transmissivity of the amorphous titanium oxide layer. If no light transmissivity is required, then the thickness is preferably as large as the process allows.

The smaller the surface roughness of the amorphous titanium oxide layer, the more preferable the surface roughness is, since, in that case, voids do not readily form between the amorphous titanium oxide layer and the electrode or the organic semiconductor layer that is formed so as to be in contact with the amorphous titanium oxide layer, and impairment of characteristics can be suppressed.

This feature will be specifically explained based on an example of an instance where an amorphous titanium oxide layer is formed on an electrode in accordance with the above-described method. If the thickness of the amorphous titanium oxide layer is small, the amorphous titanium oxide layer that is formed on the electrode grows in such a manner so as to fill the small irregularities on the electrode. If the thickness of the amorphous titanium oxide layer is excessively large, however, the amorphous titanium oxide layer grows to exhibit irregularities itself. As a result, voids become more likely to form during formation of the organic semiconductor layer on the amorphous titanium oxide layer. In terms of securing characteristic stability in the photoelectric conversion element, therefore, it is preferable that the thickness of the amorphous titanium oxide layer is set such that the surface roughness (Ra) of the amorphous titanium oxide layer is equal to or smaller than the surface roughness of the member on which the hole-blocking layer is to be formed, in the present example, the surface roughness of electrode.

ii) Drying Step

The hole-blocking layer comprising substantially amorphous titanium oxide is formed on the light-transmitting electrode layer by water removal through drying of the amorphous titanium oxide precursor that has precipitated on the surface of the base material as a result of the above-described precipitation step.

The drying means, drying temperature, and drying time are not particularly limited, and may be appropriately set on the basis of conventional techniques. In an example, a member provided with the light-transmitting electrode layer on the surface of which the amorphous titanium oxide precursor has precipitated is dried for 1 hour on a hot plate that is kept at 150° C. A member provided with an amorphous titanium oxide layer can be obtained thereby. Also, an amorphous titanium oxide layer is obtained that enalbes a photoelectric conversion element to have characteristics superior to those of a photoelectric conversion element provided with a conventional hole-blocking layer, even if drying involves no particular heating but just air drying at room temperature.

As an ordinary tendency, a higher drying temperature translates into a greater maximum output of an organic thin-film solar cell provided with the obtained hole-blocking layer. The underlying reasons for this tendency are unclear, but it is possible that a higher drying temperature brings in an optimization of the crystal structure, and thereby a higher blocking ability of generated holes in the organic semiconductor layer. Namely, the higher the drying temperature, the higher the hole-blocking ability is in the obtained hole-blocking layer. Preferably, the drying temperature is 200° C. or higher, since in this case a hole-blocking layer having excellent characteristics can be stably obtained. If there are few manufacturing constraints and hence the drying temperature can be raised, the drying temperature is more preferably 300° C. or higher. If the drying temperature exceeds 400° C., the amorphous titanium oxide layer becomes a crystalline titanium oxide ($TiO_2$) layer, and hence the drying temperature is preferably not higher than 400° C., and more preferably the upper limit of the drying temperature is set to about 380° C.

The longer the drying time is, the shorter the time that elapses until maximum output. The longer the drying time is, the weaker the influence of water may be, and hence initial power reduction is resolved in a short time. In the manufacture of photoelectric conversion elements, an aging treatment is often performed after manufacturing has been finished. Therefore, there is no need to set a particularly long drying time in the process of producing the amorphous titanium oxide layer.

The thickness of the amorphous titanium oxide layer may be appropriately set in consideration of a balance between hole-blocking ability and light transmissivity, and with productivity also in mind. As a basic tendency, a thicker amorphous titanium oxide layer results in higher hole-blocking ability, but in poorer light transmissivity. In order to increase the thickness of the amorphous titanium oxide layer, it is necessary to prolong the contact time with the aqueous solution. Photoelectric conversion efficiency is substantially constant in a case where the thickness of the amorphous titanium oxide layer is within a range from 5 to 200 nm. Therefore, the thickness of the amorphous titanium oxide layer is preferably set to range from 5 to 200 nm. More preferably, the thickness of the amorphous titanium oxide layer is set to range from 10 to 100 nm, and in particular from 10 to 50 nm.

2. Photoelectric Conversion Element

In a preferred aspect of the photoelectric conversion element according to the present invention, there are stacked a first collector electrode layer, a hole-blocking layer, an organic semiconductor layer, a hole-transport layer, and a second collector electrode layer, such that at least one of the first collector electrode layer and the second collector electrode layer has light transmissivity.

More specifically, the photoelectric conversion element according to the present embodiment comprises: a thin-film-like first collector electrode layer; a hole-blocking layer, comprising an inorganic oxide, provided on the surface of the first collector electrode layer; an organic semiconductor layer provided on the hole-blocking layer, on the face opposite to the face at which the hole-blocking layer is in contact with the first collector electrode layer; a hole-transport layer provided on the organic semiconductor layer, on the face opposite to the face at which the organic semiconductor layer is in contact with the hole-blocking layer; and a thin-film-like second collector electrode layer provided on the hole-transport layer, on the face opposite to the face at which the hole-transport layer is in contact with the organic semiconductor layer; wherein at least one of the first collector electrode layer and the second collector electrode layer has light transmissivity.

The various layers are explained in detail below for an instance where the photoelectric conversion element is an organic thin film semiconductor.

(1) First Collector Electrode Layer

The first collector electrode layer according to the present invention comprises an organic, inorganic, or metallic conductive material, and at least one of the first collector electrode layer and a below-described second collector electrode layer has light transmissivity. An example is explained below wherein the first collector electrode layer is a light-transmitting electrode layer having light transmissivity, and the second collector electrode layer comprises a metal that lacks light transmissivity.

Preferably, the light-transmitting electrode layer according to the present invention is a layer having high light transmissivity and capable of efficiently supplying, to the organic semiconductor layer, light that is irradiated onto the photoelectric conversion element. Preferably, the light-transmitting electrode layer has high electric conductivity so that the light-transmitting electrode layer efficiently extracts electric energy generated in the organic semiconductor layer.

Examples of materials in the light-transmitting electrode layer include conductive metal oxides such as ITO and FTO (fluorine-doped tin oxide), and organic transparent conductive substances such as PEDOT:PSS. Also, the light-transmitting electrode layer may be a layer comprising a metal thin film having light transmissivity. Examples of such metal thin films include gold films, silver films, and aluminum films having a thickness of 10 nm or less, preferably a thickness of about 5 nm.

The thickness of the light-transmitting electrode layer can be appropriately set in consideration of the light transmissivity and electric conductivity of the constituent materials. Preferably, the thickness ranges from about 1 to 10000 nm, more preferably from about 10 to 300 nm.

(2) Hole-Blocking Layer

A hole-blocking layer comprising the amorphous titanium oxide layer according to the present invention may be used herein. Such a hole-blocking layer has excellent characteristics, as described below. If the photoelectric conversion element is an organic thin-film solar cell, then the durability of the organic thin-film solar cell can be enhanced by using the amorphous titanium oxide layer, as compared with an instance where a crystalline titanium oxide layer ($TiO_2$ layer, for instance anatase titanium oxide layer) is used.

The thickness of the amorphous titanium oxide layer may be appropriately set in consideration of a balance between hole-blocking ability and light transmissivity, and with productivity also in mind. As a basic tendency, a thicker amorphous titanium oxide layer results in higher hole-blocking ability, but in poorer light transmissivity. In order to increase the thickness of the amorphous titanium oxide layer, it is necessary to prolong the contact time with the aqueous solution. Photoelectric conversion efficiency is substantially constant in a case where the thickness of the amorphous titanium oxide layer is within a range from 5 to 200 nm. Therefore, the thickness of the amorphous titanium oxide layer is preferably set to range from 5 to 200 nm. More preferably, the thickness of the amorphous titanium oxide layer is set to range from 10 to 100 nm, and in particular from 10 to 50 nm.

(3) Organic Semiconductor Layer

The "organic semiconductor layer" in the present invention denotes a filmy body that comprises an organic material and that exhibits the properties of a semiconductor, such that those semiconductor properties are elicited mainly by the organic material.

In particular, the organic semiconductor layer that is used as an element of the photoelectric conversion element must have a bandgap that enables generation of a charge separation state as a result of light irradiation, and the positive and negative charges generated as a result of light irradiation must have enough mobility so as to be able to continuously migrate to the first and second collector electrode layers, respectively.

Examples of a low molecular-weight material that makes up such an organic semiconductor layer include, other than pentacene, phthalocyanine derivative; a naphthalocyanine derivative; an azo compound derivative; a perylene derivative; an indigo derivative; a quinacridone derivative; a polycyclic quinone derivative such as anthraquinones; a cyanine derivative; a fullerene derivative; a nitrogen-containing cyclic compound derivative such as indole, carbazole, oxazole, isoxazole, thiazole, imidazole, pyrazole, oxadiazole, pyrazoline, and triazole; a hydrazine derivative; a triphenylamine derivative; a triphenylmethane derivative; stilbenes; a quinone compound derivative such as anthraquinone and diphenoxyquinone; a porphyrin derivative; and a polycyclic aromatic compound derivative such as anthracene, pyrene, phenanthrene, and coronene. Examples of a polymer material that makes up the organic semiconductor layer include carbon-based conjugated polymers such as aromatic conjugated polymers such as poly-p-phenylene; aliphatic conjugated polymers such as polyacetylene; heterocyclic conjugated polymers such as polypyrrole and polythiophene; heteroatom-containing conjugated polymers such as polyanilines and polyphenylene sulfide; and combined conjugated polymers having a structure in which structural units of the conjugated polymers are alternately bonded, such as poly(phenylenevinylene), poly(arylenevinylene), and poly(thienylenevinylene). Other examples include polysilanes; and polymers in which oligosilanes and carbon-based conjugated structures are alternately linked like disilanylene-carbon-based conjugated polymer structures such as disilanylene arylene polymers, (disilanylene)ethenylene polymers, and (disilanylene)ethynylene polymers. Other polymers include polymer chains comprising inorganic elements, for instance phosphorus-based and nitrogen-based ones; polymers in which an aromatic ligand is coordianted with a polymer chain such as phthalocyaninate-polysiloxane; condensed polymers obtained through thermal treatment of a perylene such as perylenetetracarboxylic acid; ladder-type polymers obtained through thermal treatment of polyethylene derivatives having cyano groups such as polyacrylonitrile; and composite materials resulting from intercalating organic compounds into perovskites.

The organic semiconductor layer may be made up of a single organic material, or may be made up of a plurality of organic materials. If made up of a plurality of organic materials, then the organic semiconductor layer may have a stacked structure, or may be a mixture. In an example, a organic semiconductor layer has a structure such that a self-assembled film (SAM: self-assembled monolayer), specifically a fullerene derivative, is formed at the interface with the hole-blocking layer, while other portions of the organic semiconductor is a mixture of a plurality of organic semiconductors, specifically, the above-described mixture of P3HT and PCBM.

The organic semiconductor layer according to the present invention may contain a material such as an inorganic material, besides the organic material, but the semiconductor characteristics of the organic semiconductor layer should be elicited mainly by the organic material.

In terms of enhancing the functionality of the photoelectric conversion element, the organic semiconductor layer according to the present invention preferably comprises a conjugated polymer as an electron donor, and a fullerene derivative as an electron acceptor. That is, a preferred aspect of the photoelectric conversion element according to the present invention belongs to so-called bulk heterojunction organic thin-film solar cells.

Specific examples of conjugated polymers as the electron donor include the above-described P3HT, and also PCP-DTBT (poly[2,6-(4,4-bis(2-ethyl-hexyl)-4H-cyclopenta[2,1-b:3,4-b']thiophene)-alt-4,7-(2,1,3-benzothiadiazole)]), and also PA-PPV (poly(phenylimino-1,4-phenylene-1,2-ethynylene-2,5-dihexyloxy-1,4-phenylene-1,2-ethynylene-1,4-phenylene))

Specific examples of fullerene derivatives as the electron acceptor include the above-described PCBM, $PC_{70}BM$, as well as bis[70]PCBM and bis[60]PCBM represented by the formula below.

[C3]

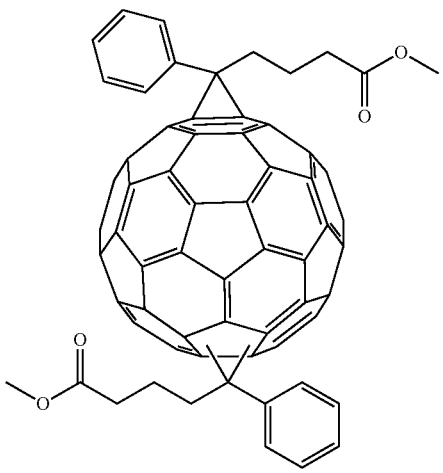

The organic semiconductor layer may be formed only of two components, namely, a conjugated polymer and a fullerene derivative. A colorant or a conductive material having a photoelectric conversion action may be further added thereto.

Examples of the conductive material (except PEDOT:PSS) include polyacetylene-based materials, polypyrrole-based materials, polythiophene-based materials, poly-p-phenylene-based materials, poly-p-phenylenevinylene-based materials, polythienylenevinylene-based materials, poly(3,4-ethylene-dioxythiophene)-based materials, polyfluorene-based materials, polyaniline-based materials, and polyacene-based materials.

Examples of the colorant include cyanine-based colorants, merocyanine-based colorants, phthalocyanine-based colorants, naphthalocyanine-based colorants, azo-based colorants, quinone-based colorants, quinonimine-based colorants, quinacridone-based colorants, squarylium-based colorants, triphenylmethane-based colorants, xanthene-based colorants, porphyrin-based colorants, perylene-based colorants, and indigo-based colorants.

In a case where the organic semiconductor layer is made up of two components, namely, the conjugated polymer and the fullerene derivative, the blending ratio of the two components is not particularly limited. When using P3HT as the conjugated polymer and PCBM as the fullerene derivative, the ratio P3HT:PCBM (ratio by weight) ranges preferably from about 5:3 to 5:6, more preferably from about 5:3 to 5:4.

If other additives (conductive materials, colorants, and the like) are added, the addition amount of each additive is not particularly limited, but ranges preferably from about 1 to 100 parts by weight, more preferably from about 1 to 40 parts by weight with respect to a total 100 parts by weight of the sum of the conjugated polymer and the fullerene derivative.

The method for forming the organic semiconductor layer is not particularly limited. For instance, the organic semiconductor layer may be formed through spin-coating of a solution containing the conjugated polymer and the fullerene derivative, onto the hole-blocking layer of a member that comprises the hole-blocking layer. The solvent in that solution may be, for example, a 2,6-dichlorotoluene:chloroform mixed solvent.

If other additives are present, these are preferably mixed into or dissolved in the solution beforehand.

The thickness of the organic semiconductor layer is not particularly limited, but ranges preferably from about 50 to 400 nm, more preferably from about 200 to 300 nm.

In a case where the organic semiconductor layer that comprises the conjugated polymer and the fullerene derivative is produced by spin-coating, the obtained organic semiconductor layer is preferably dried at 60 to 150° C., preferably at 80 to 120° C., for 10 to 30 minutes. Doing so has the effects of enabling the solvent included in the organic semiconductor layer to reliably volatilize, and of promoting bulk-heterojunction phase separation that is advantageous for generating photo-carriers between the conjugated polymer (for instance, P3HT) and the fullerene derivative (for instance, PCBM). Crystallization of P3HT is also progressed. As a result, there is less likely to cause a situation where the charge generated in the organic semiconductor layer through light irradiation is trapped by constituent molecules of the solvent or by amorphous P3HT.

(4) Hole-Transport Layer

The photoelectric conversion element according to the present invention may have a hole-transport layer between the organic semiconductor layer and the second collector electrode layer. Herein, the term "hole-transport layer" denotes a layer having a function of facilitating that charge transfer between the organic semiconductor layer and the second collector electrode layer is carried by holes, and preferably, suppressing charge transfer from being carried by electrons. That is, the hole-transport layer has a p-type semiconductor characteristic in which electrical conduction is carried by holes.

The presence of a hole-transport layer between the organic semiconductor layer and the second collector electrode layer has the effects of causing holes, from among the charges generated in the organic semiconductor layer as a result of light irradiation, to preferentially reach the second collector electrode layer, and of enhancing photoelectric conversion efficiency.

The material that makes up the hole-transport layer in the photoelectric conversion element according to the present invention is not particularly limited, so long as the material functions as a hole-transport layer. Specific examples thereof include phthalocyanine derivatives such as copper phthalocyanine; bis(di(p-tolyl)aminophenyl)-1,1-cyclohexane, N,N,N',N'-tetra-amino-4,4'-diaminobiphenyl; triphenyl diamines such as the above-described NPD; starbust-type molecules such as tris(4-(N,N-di-m-tolylamino)phenyl)amine; acenes such as anthracene, tetracene and pentacene; and polyalkylthiophenes such as the above-described P3HT, poly-3-octylthiophene (P3OT), and poly-3-dodecylthiophene (P3DDT). Other examples include poly[bis(4-phenyl)(2,4,6-trimethylphenyl)amine] (PTAA), poly[2-methoxy-5-(2-ethylhexyloxy)-1,4-phenylenevinylene] (MEH-PPV), poly[2-methoxy-5-(3',7'-dimethyloctyloxy)-1,4-phenylenevinylene] (MDMO-PPV), poly[9,9-di-n-octylfluorenyl-2,7-diyl]-alt-(benzo[2,1,3]thiadiazole-4,8-diyl)] (F8BT), poly[9,9-di-n-octylfluorenyl-2,7-diyl]-co-bithiophenyl] (F8T2).

These materials may be used singly, or in the form of a stack or a mixture of a plurality of the materials.

The most ordinary material from among the materials is PEDOT:PSS, which is a mixture of poly-3,4-ethylenedioxythiophene (PEDOT) and polystyrene sulfonate (PSS).

Preferably, the photoelectric conversion element according to the present invention uses PEDOT:PSS as the hole-transport layer. Preferably, in particular, the hole-transport layer is produced in a process that has a step of bringing into contact of an aqueous solution containing PEDOT and PSS, as well as an nonionic surfactant, with the surface of an organic semiconductor layer in a member that is a stack of a light-transmitting electrode layer, a hole-blocking layer, and an organic semiconductor layer.

Conventionally, PEDOT:PSS was formed in accordance with a method such as spin-coating, using a commercially available aqueous dispersion containing PEDOT and PSS (for instance, 1.3 percent by weight aqueous dispersion produced by Aldrich), without modification.

In a case where the organic semiconductor layer comprises a conjugated polymer as the electron donor and a fullerene derivative as the electron acceptor, however, the organic semiconductor layer is hydrophobic, and hence it is not possible to form a homogeneous dispersion layer on the organic semiconductor layer, in an attempt to spin-coat the above-described aqueous dispersion. As a result, the thickness of the formed hole-transport layer became likewise non-homogeneous, and it was difficult to realize sufficient hole transport characteristics.

In the present invention, accordingly, a nonionic surfactant is added to the aqueous dispersion that contains the above-described PEDOT and PSS, to increase the wettability of the aqueous dispersion towards the organic semiconductor layer according to the present invention. As a result, a homogeneous dispersion layer is formed upon contact of the aqueous dispersion containing PEDOT and PSS with the organic semiconductor layer according to the present invention, and there can be realized, accordingly, a hole-transport layer of uniform thickness.

Specific examples of the nonionic surfactant included in the aqueous dispersion according to the present invention include polyoxyalkylene alkyl ethers, fatty acid alkanol amides, polyoxyethylene sorbitan esters, sorbitan esters, sorbitol esters, sucrose fatty acid esters, methyl glucoside esters, methyl mannoside esters, ethyl glucoside esters, N-methyl glucamides, cyclic N-methyl glucamides, alkyl glucosides, alkyl polyglucosides, alkyl glyceryl ethers, polyoxyethylene alkyl ethers, polyoxyethylene alkyl phenyl ethers, sorbitan fatty acid esters, polyoxyethylene acyl esters, fatty acid glycoside esters, fatty acid methyl glycoside esters, and alkyl methyl glucamides. The nonionic surfactants preferably have an HLB (hydrophile-lipophile balance) ranging from about 10 to 20, namely, have high hydrophilicity. There is a plurality of methods for calculating HLB values the Atlas method, the Griffin method, the Davis method, the Kawakami method and the like. The calculation method is not particularly limited, so long as hydrophilicity dominates relatively over lipophilicity.

A preferred example of such a nonionic surfactant is a polyoxyalkylene alkyl ether represented by formula (1) below.

$$R(OCH_2CH_2)_nOH \quad (1)$$

In the formula, R denotes an alkyl group having from 10 to 15 carbon atoms, and n is an integer ranging from 5 to 15.

A more specific example is polyoxyethylene tridecyl ether (PTE, $C_{13}H_{27}(OCH_2CH_2)_nOH$, n=integer from 6 to 12).

Other examples of preferred nonionic surfactants include a nonionic surfactant having groups that form cyclic π-electron conjugated systems such as a polyoxyethylene alkyl phenyl ether (this compound is available in the form of Triton X-100 ™ by Roche Diagnostics K.K.). Such groups interact readily with PEDOT:PSS as the dispersoid, and hence a surfactant having such groups promotes the dispersion of PEDOT and PSS in water. Therefore, an aqueous dispersion in which the dispersoid is dispersed yet more homogeneously can be achieved. Since the organic semiconductor layer often comprises groups that form cyclic π-electron conjugated systems like fullerene derivatives, surfactants having such groups readily interact with the organic semiconductor at the surface of the organic semiconductor layer that comes into contact with the aqueous dispersion. Accordingly, the surface of the organic semiconductor layer is rendered more hydrophilic, and wettability towards the aqueous dispersion is enhanced. This contributes to forming a homogeneous hole-transport layer.

The addition amount of the nonionic surfactant to the aqueous dispersion that contains PEDOT and PSS is appropriately set in consideration of the hydrophobicity of the organic semiconductor layer, the composition of the aqueous dispersion, the characteristics of the nonionic surfactant, and the like, and in such a manner that the hole-transport layer can be formed appropriately on the organic semiconductor layer.

The method for forming the hole-transport layer is not particularly limited. For instance, the hole-transport layer may be formed through spin-coating of an aqueous dispersion containing PEDOT and PSS, and having a nonionic surfactant added thereto, onto the organic semiconductor layer of a member that contains the organic semiconductor layer. The dispersion may be heated (for instance, at 50 to 90° C.), in order to enhance the wettability of the organic semiconductor layer to the dispersion.

The thickness of the hole-transport layer is not particularly limited, but ranges preferably from about 20 to 120 nm, more preferably from about 30 to 90 nm.

(5) Second Collector Electrode Layer

The second collector electrode layer according to the present invention comprises an organic, inorganic or metallic conductive material, and at least one of the first collector electrode layer and the second collector electrode layer has light transmissivity.

In a case where the second collector electrode layer according to the present invention comprises a metal lacking light transmissivity, the second collector electrode layer comprises preferably a gold electrode. The production method of the gold electrode is not particularly limited. A gold film may be formed according to a known method such as vacuum vapor deposition on the organic semiconductor layer, or on the hole-transport layer that is formed on the organic semiconductor layer.

In cases where damage to the organic semiconductor layer formed by a vacuum film formation process, or damage to the hole-transport layer formed on the organic semiconductor layer is a problem, a metal foil or ITO (specific examples include aluminum foil or film ITO), having gold or silver thinly vapor-deposited beforehand on the surface, may be brought into contact with the surface of the organic semiconductor layer or of the hole-transport layer that is formed on the organic semiconductor layer.

It is preferable for a second collector electrode layer formed by any method to heat a region that encompasses the interface between the second collector electrode layer and the organic semiconductor layer or the hole-transport layer formed on the organic semiconductor layer, at a temperature ranging from about 80 to 150° C., for about 5 minutes, with a view to enhancing the electric conductivity between the second collector electrode layer and the organic semiconductor layer or the hole-transport layer formed on the organic semiconductor layer.

Preferably, the entire member in which the photoelectric conversion element is formed is further subjected to an aging treatment at a temperature of about 70° C. for about 1 hour.

In a case where the first and second collector electrode layers according to the present invention have light transmissivity, a structure in which the photoelectric conversion element as a whole has light transmissivity can be achieved. If such a photoelectric conversion element is affixed to window glass or the like, power can be generated while letting daylight in.

The photoelectric conversion element comprising the first collector electrode layer, the hole-blocking layer, the organic semiconductor layer and the second collector electrode layer, and, as the case may require, the hole-transport layer, may be stacked in the form of a plurality of elements, to yield a tandem-type photoelectric conversion element. In such a case, the two collector electrode layers that constitute connection sections of the stacked photoelectric conversion elements may be integrally formed with each other. Examples of such a photoelectric conversion element include a photoelectric conversion element in which a first collector electrode layer, a hole-blocking layer, an organic semiconductor layer, a collector electrode layer that constitutes a second collector electrode layer-cum-first collector electrode layer, an organic semiconductor layer, and a second collector electrode layer are stacked in this order.

In a case where a hole-transport layer is added and photoelectric conversion takes place on the basis of differences in hole mobility between the hole-blocking layer and the hole-transport layer, there can be obtained a photoelectric conversion element having a stacked structure that comprises a transparent collector electrode layer, a hole-blocking layer, an organic semiconductor layer, a hole-transport layer, a transparent collector electrode layer, a hole-blocking layer, an organic semiconductor layer, a hole-transport layer, a transparent collector electrode layer, . . . .

2. Organic Thin-Film Solar Cell Panel

An organic thin-film solar cell panel according to the present invention comprises a light-transmitting substrate; a photoelectric conversion element according to the present invention which is located on the light-transmitting substrate so that an electrode layer having light transmissivity of the photoelectric conversion element is in contact with the light-transmitting substrate; and a chassis that seals the photoelectric conversion element.

A known transparent substrate such as a glass substrate and a resin film can be used as the light-transmitting substrate. In particular, using a resin film or the like is preferable in terms of achieving a flexible panel by imparting flexibility to the organic thin-film solar cell panel.

The chassis that seals the photoelectric conversion element according to the present invention is not particularly limited, so long as it is a member that can seal the photoelectric conversion element from air by sandwiching the photoelectric conversion element with the transparent substrate. The shape of the chassis is not limited, and may be box-like, plate-like or the like. In terms of achieving a chassis-sealed organic thin-film solar cell panel having a thinner profile, the chassis is preferably a flat thin plate-like glass sheet. Using a chassis in the form of a pliable resin film is preferable, since doing so allows achieving a flexible panel by imparting flexibility to the organic thin-film solar cell panel.

II. Second Embodiment

The present invention provides, as a second embodiment, a hole-blocking layer that is produced according to a process that has: a step of bringing into contact a nonaqueous solution (hereafter, "nonaqueous solution" for short) that contains an organic titanium compound represented by formula (2) below and a lower alkylamine (hereafter, "complexing agent") such as diethylamine, triethylamine or the like, with the surface of a member (hereafter, "base material") on which a hole-blocking layer is to be formed, to thereby form a liquid layer of the nonaqueous solution (hereafter, "nonaqueous solution layer") on the surface of the base material; a step of forming, in the nonaqueous solution layer, a hydrolysis product of the organic titanium compound by hydrolyzing the organic titanium compound included in the nonaqueous solution layer; and a step of drying the nonaqueous solution layer that contains the hydrolysis product of the organic titanium compound.

$$Ti(OR^1)_4 \qquad (2)$$

In the formula, $R^1$ denotes identical or different substituents selected from the group consisting of alkyl groups a having from 1 to 8 carbon atoms, cycloalkyl groups and aryl groups, as well as hydroxy, alkoxy, amino and/or fluoro derivatives thereof.

Such a production method allows setting the drying temperature during the drying step to about 100° C. Therefore, a hole-blocking layer can be formed without deterioration of a resin film, of PET or the like, as the member on which the hole-blocking layer is to be formed.

Therefore, it becomes possible for a photoelectric conversion element of high photoelectric conversion efficiency to be formed on a film substrate, and hence a so-called flexible solar cell can be realized. Other elements that make up the photoelectric conversion element are identical to those of the photoelectric conversion element according to the first embodiment, and hence an explanation thereof will be omitted.

The steps of the above-described production method are explained in detail next.

(1) Contact Step

In the contact step, a nonaqueous solution (nonaqueous solution containing an organic titanium compound and a complexing agent) is brought into contact with the surface of a base material (member on which a hole-blocking layer is to be formed), to thereby form a nonaqueous solution layer on the surface of the member.

The nonaqueous solution used in the contact step comprises an organic titanium compound that constitutes a titanium source of the amorphous titanium oxide that makes up the hole-blocking layer, and a lower alkylamine, as a complexing agent for stabilizing ions which include titanium and are formed out of the organic titanium compound. The solution may comprise other components, so long as formation of an amorphous titanium oxide is not impaired by the components. The solution is a nonaqueous solution, and hence contains substantially no water. If water is present, hydrolysis occurs before the process reaches a subsequent hydrolysis step, and both productivity and the characteristics of the hole-blocking layer are impaired.

Specific examples of the organic titanium compound represented by formula (1) include tetramethyl titanate, tetraethyl titanate, tetraisopropyl titanate, tetrabutyl titanate, tetra (sec-butyl) titanate, tetra(tert-butyl) titanate, tetra(2-ethylhexyl)titanate, tetracyclohexyl titanate, tetraphenyl titanate, tetra(2,6-xylyl)titanate, tetra(2-hydroxyethyl) orthotitanate, tetrakis[2-[(2-propenyl)oxymethyl]butoxy]titanate, α-titanium acid tetrakis[2-(dimethylamino)ethyl]ester, tetra(2,2,2-trifluoroethyl)titanate, and tetra[1-(trifluoromethyl)-2,2,2-trifluoroethyl]titanate. Particularly preferred among the foregoing are tetraethyl titanate, tetraisopropyl titanate and tetrabutyl titanate, which have comparatively high handleability, and readily yield volatile substances when hydrolyzed.

The concentration of the organic titanium compound in the nonaqueous solution is appropriately set in consideration of the facts that the thickness of the obtained hole-blocking layer is too small if the concentration is excessively low, and that the stability of the nonaqueous solution markedly drops if the concentration is excessively high. Preferably, the concentration ranges from 0.1 to 1 mol/L.

A lower alkylamine such as diethylamine and triethylamine has high functionality as a complexing agent. Lower alkylamines are also preferable in that they have a boiling point ranging from about 50 to 150° C. (diethylamine: 55° C., triethylamine: 89° C.), and hence the lower alkylamine can thoroughly volatilize, at a comparatively low temperature, during the drying step, while the lower alkylamine does not readily volatilize in the contact step and the hydrolysis step both which step are performed at room temperature in general. In the present invention, therefore, the "lower alkylamine" denotes a lower alkylamine having excellent complex-formation ability towards ions including as titanium, and having a boiling point not higher than 150° C., preferably not higher than 100° C. The lower alkylamine may be a monoalkylamine, a dialkylamine or a trialkylamine. The lower alkylamine may be made up of one single compound, or of a plurality of compounds.

Particularly preferred among the foregoing is diethylamine, since the diethylamine affords stable drying even at a drying temperature not higher than 100° C. A drying temperature not higher than 100° C. makes it possible to use a polymer material, such as PET, in the substrate on which the photoelectric conversion element is formed.

When using acetyl acetone disclosed in document Patent Document 2 as a complexing agent, drying under reduced-pressure conditions is required so that the drying step is to be carried out within a realistic operation time, with productivity in mind. Herein, reduced-pressure drying detracts from workability and from quality stability.

The concentration of the lower alkylamine in the nonaqueous solution is appropriately set taking into account that an excessively low concentration precludes bringing out the function of stabilizing the organic titanium compound in the nonaqueous solution, and that volatilization takes time, in the drying step, if the concentration of the lower alkylamine is excessively high. Preferably, the concentration ranges from 0.1 to 4 mol/L.

The molar ratio of the organic titanium compound with respect to the total complexing agent (organic titanium compound/complexing agent) is not particularly limited, but ranges preferably from 0.1 to 2, more preferably from 0.25 to 1, in terms of enabling the complexing agent to appropriately function and of improving the characteristics of the hole-blocking layer to be obtained. A particularly preferred range is 0.3 to 0.7.

Preferably, the solvent of the nonaqueous solution is a polar solvent, such as an alcohol or the like, from the viewpoint of enhancing the solubility of the above-described solutes. If an alcohol is used as a solvent, however, the alcohol should be thoroughly dehydrated beforehand, since alcohols are likely to contain water, and hydrolysis may be brought about by the water in the solvent. Preferred examples of the solvent include 2-methoxyethanol and isopropanol.

The contact method between the nonaqueous solution and the base material is not particularly limited, and any means may be employed, for instance dipping, spraying, spin-coating, roll-coating or discharge, by ink-jetting, of the nonaqueous solution. Spin-coating is a preferred contact means, since spin-coating allows controlling the thickness of the nonaqueous solution layer in a simple manner.

The thickness of the nonaqueous solution layer is appropriately set in consideration of the concentration of solutes in the nonaqueous solution layer and the like.

(2) Hydrolysis Step

In the hydrolysis step, the organic titanium compound included in the nonaqueous solution layer that is formed on the base material, as a result of the contact step, is hydrolyzed to thereby form a hydrolysis product of the organic titanium compound in the nonaqueous solution layer.

The hydrolysis method is not particularly limited. As described above, the nonaqueous solution contains substantially no water. Therefore, water is appropriately supplied to the nonaqueous solution layer to cause the organic titanium compound in the nonaqueous solution layer to hydrolyze, and form thereby a hydrolysis product that constitutes an amorphous titanium oxide precursor.

The simplest method for appropriately supplying water to the nonaqueous solution layer involves leaving the nonaqueous solution layer to stand in an atmosphere of appropriate humidity. For instance, the organic titanium compound in the nonaqueous solution layer can be hydrolyzed by leaving the nonaqueous solution layer to stand for 30 minutes in an environment at 45% relative humidity (temperature: 25° C.)

If the hydrolysis step is performed by exposure to a moisture-containing environment, then the hydrolysis step can be carried out substantially simultaneously with the drying step that is explained next by raising the temperature of the environment. In this case, attention must be paid so as to prevent the solvent from volatilizing before hydrolysis is sufficiently advanced. From this viewpoint, the environment temperature may be raised gradually or in a stepwise manner.

(3) Drying Step

The nonaqueous solution layer containing the hydrolysis product of the organic titanium compound is dried in the drying step. As a result of this step, a hole-blocking layer comprising substantially an amorphous titanium oxide (which may have a small amount of residue such as solvent, complexing agent, water, and so forth) becomes formed on the base material.

The drying means, drying temperature and drying time may be appropriately set on the basis of conventional techniques in such a way so as to elicit volatilization of the solvent, the complexing agent, and so forth. The solvent and the complexing agent contained in the nonaqueous solution have comparatively low boiling points. Therefore, the drying step can be performed with high productivity, in a comparatively short time, by setting the drying temperature to about 100° C.

In an example, a hole-blocking layer can be formed on the base material by drying the base material, which has a hydrolysis product formed on the surface thereof, for about 1 hour on a hot plate kept at 100° C.

The thickness of the hole-blocking layer may be appropriately set in accordance with the characteristics of the element in which the layer is to be used. If the hole-blocking layer is used in a photoelectric conversion element, the thickness of the hole-blocking layer is then appropriately set in consideration of a balance between hole-blocking ability and light transmissivity, as well as productivity. In an example where the hole-blocking layer is used in a photoelectric conversion element, the thickness of the hole-blocking layer is preferably set to range from 5 to 200 nm. More preferably, the thickness in of the hole-blocking layer ranges from 10 to 100 nm, and, in particular, is set to range from 10 to 50 nm.

The hole-blocking layer produced in accordance with the above-described method has excellent hole-blocking ability and exhibits high productivity, similarly to those of a hole-blocking layer formed from an aqueous solution.

EXAMPLES

The present invention is explained in specific terms below by way of examples and comparative examples. However, the present invention is in no way limited to the examples.

Example 1

(1) Production of an Organic Thin-Film Solar Cell

An aqueous solution (hereafter, "aqueous solution" for short) was prepared that contained 0.03 mol/L of hydrogen peroxide ($H_2O_2$) and 0.03 mol/L of titanium (IV) oxysulfate ($TiOSO_4$).

There was prepared a glass substrate with ITO film (Furuuchi Chemical) resulting from overlaying an ITO film, by sputtering, onto one of the surfaces of a glass substrate (22 mm×38 mm, thickness 1.1 mm). The thickness was 200 nm, and the sheet resistance of the ITO film that made up the light-transmitting electrode layer was 10 Ω/square.

The face of the glass substrate on the side opposite to the face on which the ITO film was formed was covered with a polyimide film, and the whole glass substrate was then boil-washed in 2-propanol.

The glass substrate after washing, having the ITO film formed on one face thereof, and the other face covered by the polyimide film, was immersed for 5 minutes in the aqueous solution the temperature of which was kept at 80° C. using an oil bath.

The glass substrate was removed from the aqueous solution, and the removed glass substrate was then left to stand for 1 hour in a 150° C. atmosphere, to thereby form a 30 nm-thick amorphous titanium oxide layer on the ITO film of the glass substrate.

A 2,6-dichlorotoluene:chloroform solution (mixture volume ratio; 2,6-dichlorotoluene:chloroform=1:1) containing 3.9 percent by weight of the mixture of P3HT (polythiophene derivative, by Aldrich) and a fullerene derivative PCBM (by Frontier Carbon), at a mass ratio of 5:4, was prepared.

The 2,6-dichlorotoluene:chloroform solution was spin-coated (1500 rpm, 60 s) onto the amorphous titanium oxide layer, and the whole was dried for about 10 minutes, at room temperature, to form a 250-nm organic semiconductor layer.

There was prepared a nonionic surfactant (by Aldrich) containing 1 percent by weight of polyoxyethylene tridecyl ether ($C_{13}H_{27}(OCH_2CH_2)_nOH$, n=6) and 1 percent by weight of xylene, and having water and isopropanol as solvents, and 0.5 parts by weight of this nonionic surfactant were mixed with 100 parts by weight of a 1.3 percent by weight PEDOT:PSS aqueous dispersion (by Aldrich), to prepare a PTE-containing PEDOT:PSS aqueous dispersion.

The above-described PTE-containing PEDOT:PSS aqueous dispersion was heated at 50 to 90° C., and was then spin-coated (6000 rpm, 60 s) onto the organic semiconductor layer. Natural drying was performed at room temperature, to thereby form a 80-nm hole-transport layer.

Next, an Au electrode layer (collector electrode layer) was vacuum vapor-deposited, to a film thickness of about 100 nm, onto the hole-transport layer. Specifically, a shadow mask corresponding to an 4 mm×25 mm electrode shape, plus the glass substrate up to the stage of having the hole-transport layer formed thereon, were placed in a chamber, and the interior of the chamber was evacuated using a rotary pump and a turbomolecular pump, to bring the pressure inside the chamber to $2\times10^{-3}$ Pa or less. A gold wire in the chamber was resistively heated, to form 100 nm of gold on the hole-transport layer, via the shadow mask. The film formation rate was set to 10 to 15 nm/min, and the pressure during film formation was set to $1\times10^{-2}$ Pa or less.

Thereafter, the glass substrate having formed on one face thereof, in accordance with the above-described production method, the ITO film (light-transmitting electrode layer), the hole-blocking layer, the organic semiconductor layer, the hole-transport layer, and the gold film as the collector electrode layer, was subjected to a heating treatment for 5 minutes at 150° C., and was further held at 70° C. for 1 hour.

As a result of the above-described steps there was produced an organic thin-film solar cell having a photoelectric conversion surface area of 4 mm×25 mm, namely, 1.0 cm².

(2) Evaluations

The organic thin-film solar cell panel produced according to the above-described production method was evaluated as follows, in an unsealed state in the atmosphere.

i) Current-Voltage Characteristics

Pseudo sunlight having a light intensity of 100 mW/cm² and an AM1.5G spectral distribution was irradiated, using a solar simulator (XES-502S, by SAN-EI Electric), onto the organic thin-film solar cell panel, from the side of the ITO electrode layer. In this state, the photocurrent-voltage profile of the organic thin-film solar cell was measured using a linear sweep voltammetry (LSV) instrument (HZ-5000, by Hokuto Denko).

The short-circuit current (absolute value, $J_{sc}$/mA cm$^{-2}$), open circuit voltage ($V_{oc}$/V), fill factor (FF), and energy conversion efficiency (η/%) were calculated on the basis of the measured profile.

ii) Durability

The open circuit voltage was continuously measured, and also the photocurrent-voltage profile was measured, at hourly intervals, using the above-described LSV measurement instrument in a state where the AM1.5G-100-mW/cm² pseudo-sunlight was continuously irradiated onto the organic thin-film solar cell, using the above-described light source. The durability of the solar cell performance was evaluated on the basis of the obtained photocurrent-voltage profiles of the organic thin-film solar cell.

Example 2

A member having a 30 nm-thick amorphous titanium oxide layer formed on the ITO film of a glass substrate was produced in accordance with the production method disclosed in Example 1.

A 2,6-dichlorotoluene:chloroform solution (mixture volume ratio; 2,6-dichlorotoluene:chloroform=1:1) containing 3.9 percent by weight of the mixture of P3HT (polythiophene derivative, by Aldrich) and a fullerene derivative bis[60]PCBM (by Solenne), at a mass ratio of 5:4, was prepared.

The 2,6-dichlorotoluene:chloroform solution was spin-coated (1500 rpm, 60 s) onto the amorphous titanium oxide layer, and the whole was dried for about 10 minutes, at room temperature, to form a 250-nm organic semiconductor layer.

An organic thin-film solar cell was produced subsequently in accordance with the sample production method as in Example 1.

The current-voltage characteristics of this organic thin-film solar cell were evaluated in the same way as in Example 1.

Durability was evaluated also in the same way as in Example 1.

Comparative Example 1-1

An organic thin-film solar cell was produced in the same way as in Example 1, but herein there was formed a hole-blocking layer comprising 30 nm-thick amorphous titanium oxide, in accordance with the method disclosed in Example 1-1 of Patent Document 2.

The current-voltage characteristics of this organic thin-film solar cell were evaluated in the same way as in Example 1.

Comparative Example 1-2

An organic thin-film solar cell was produced in the same way as in Example 1, but herein there was formed a hole-blocking layer comprising 90 nm-thick amorphous titanium oxide, in accordance with the method disclosed in Example 1-2 of Patent Document 2.

The current-voltage characteristics of this organic thin-film solar cell were evaluated in the same way as in Example 1-1.

Comparative Example 2

An organic thin-film solar cell was produced in accordance with a production method identical to that of Example 1, but herein the material of the light-transmitting electrode layer was changed from ITO to FTO, and the hole-blocking layer was an oxide semiconductor layer comprising 100 nm-thick $TiO_2$ produced in accordance with the production method set forth in Patent Document 1, i.e. the below-described production method, instead of the production method disclosed in Example 1.

An amount of 5 mL of dehydrated toluene was weighed and put in a 100 mL three-necked flask with nitrogen gas stream, and the flask was cooled for 10 minutes in an ice-water bath. Then, 4.25 g of titanium tetra-n-butoxide (grade-1 reagent, by Wako Pure Chemicals Industries) was dripped slowly into the flask, using a syringe, while under stirring of the toluene in the flask. The toluene solution after dripping was then stirred for 30 minutes while under cooling in an ice-water bath, in a nitrogen atmosphere. Next, the toluene solution in the flask was heated for 1 hour at 80° C., in a nitrogen atmosphere. The solution after heating was left to cool for 10 minutes, followed by cooling the flask for 30 minutes in an ice-water bath.

Then, 0.37 g of distilled water were weighed and put in a 25 mL measuring flask, in such a manner that the molar concentration ratio of Ti and $H_2O$ in the $TiO_2$ precursor solution eventually obtained would be Ti:$H_2O$=1:1.5. Dehydrated 1-butanol (special-grade reagent, by Wako Pure Chemicals Industries) was added to the flask, to prepare 20 mL of 0.825-mol/L $H_2O$-containing 1-butanol. This $H_2O$-containing 1-butanol was dripped slowly into the above-described toluene solution after cooling. The solution after dripping was stirred for 30 minutes while under cooling in an ice-water bath, in a nitrogen atmosphere. Next, the solution was heated for 2 hours at 60° C. in the nitrogen atmosphere. The solution after heating was left to cool for 10 minutes, followed by cooling the flask for 30 minutes in an ice-water bath.

The flask with the solution after cooling was immersed in a water bath kept at a bath temperature from 30 to 50° C., and the solution was concentrated, using an evaporator, until no further solvent volatilization. The liquid after concentration was diluted with 15 mL of dehydrated 2-propanol (organic synthesis reagent, by Kanto Chemical), to yield a $TiO_2$ precursor solution.

The $TiO_2$ precursor solution prepared in accordance with the above-described procedure was dripped, in an amount of about 0.15 mL, onto an FTO substrate, and was spin-coated at 2000 rpm for 1 minute.

Pre-drying was performed for 1 hour on a hot plate set at 100° C., followed by baking in a muffle furnance set at 450° C. for 1 hour.

The above-described operation of spin-coating of the precursor solution, pre-drying, and baking was repeated three times, to yield a 100 nm-thick oxide semiconductor layer comprising $TiO_2$ by which irregularities of the FTO substrate surface were lessened.

The current-voltage characteristic of this organic thin-film solar cell was evaluated in the same way as in Example 1.

Durability was evaluated also in the same way as in Example 1.

Figure 2:
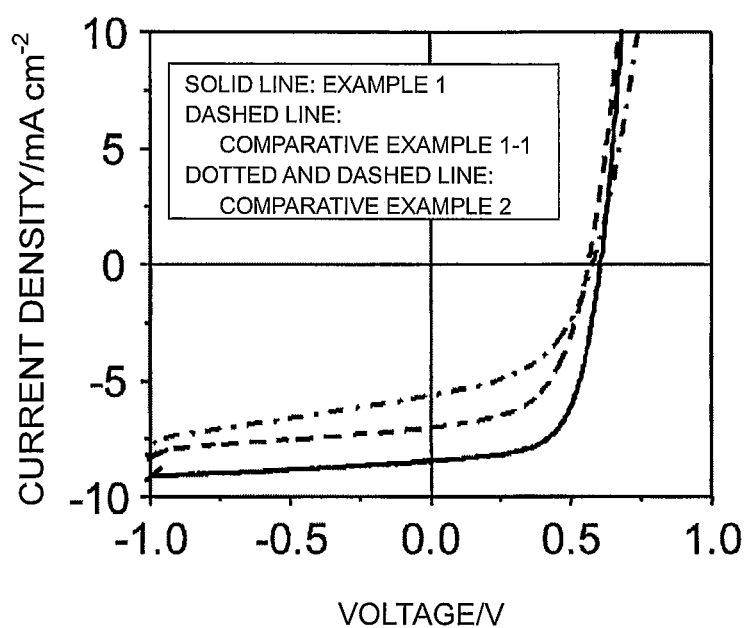
FIG. 2 is a graph illustrating evaluation results of current-voltage characteristics in a photoelectric conversion element according to the present invention.
Figure 3:
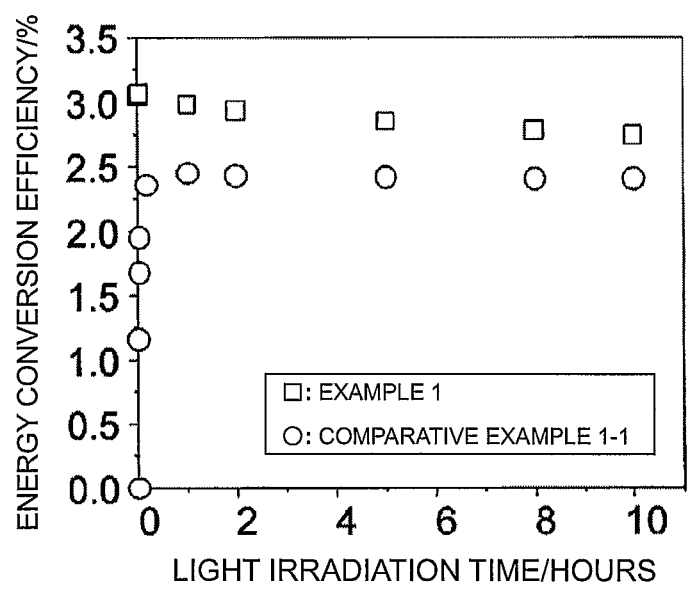
FIG. 3 is a graph illustrating evaluation results of durability in a photoelectric conversion element according to the present invention.

Table 1 and FIG. 2 illustrate the results of the evaluation of current-voltage characteristics. Table 2 gives the results of durability evaluation of the organic thin-film solar cell according to Example 1. Table 3 and FIG. 3 comparatively illustrate the durability evaluation results of the organic solar cells according to Example 1 and Comparative Example 1-1.

TABLE 1

|  | $J_{SC}$/mA cm$^{-2}$ | $V_{OC}$/V | FF | η/% |
|---|---|---|---|---|
| Example 1 | 8.5 | 0.61 | 0.62 | 3.2 |
| Example 2 | 7.9 | 0.76 | 0.63 | 3.8 |
| Comp. ex. 1-1 (sol-gel method) | 7.0 | 0.56 | 0.55 | 2.2 |
| Comp. ex. 1-2 (electroreductive precipitation) | 6.9 | 0.55 | 0.56 | 2.1 |
| Comp. ex. 2 | 5.6 | 0.58 | 0.49 | 1.6 |

TABLE 2

| Irradiation time/hours | $J_{SC}$/mA cm$^{-2}$ | $V_{OC}$/V | FF | η/% |
|---|---|---|---|---|
| 0 | 8.55 | 0.61 | 0.59 | 3.05 |
| 0.017 (1 minute) | 8.60 | 0.60 | 0.59 | 3.06 |
| 1 | 8.22 | 0.59 | 0.61 | 2.98 |
| 2 | 8.04 | 0.59 | 0.62 | 2.93 |
| 10 | 7.60 | 0.59 | 0.61 | 2.74 |

TABLE 3

|  | Highest value of Energy conversion efficiency and time when reached | Energy conversion efficiency after 10 h of continued irradiation | Relative retention |
|---|---|---|---|
| Example 1 | 3.06%, 1 min | 2.74% | 90% |
| Comp. ex. 1-1 | 2.45%, 1 hour | 2.40% | 98% |

As the tables show, the organic thin-film solar cells in the examples had an initial photoelectric conversion efficiency in excess of 3%, and in particular, a high photoelectric conversion efficiency of 3.8% was obtained in the case where bis[60]PCBM was used. The organic thin-film solar cells was confirmed to have also excellent durability, by the result that a relative rate of decrease of energy conversion efficiency was 10%, even after 10 hours of continued irradiation.

The open circuit voltage in the organic thin-film solar cell according to Comparative Example 2 dropped to 0.1 V or less in about 10 minutes, and durability could not be measured. That can be because the oxide semiconductor layer (hole-blocking layer) in the organic thin-film solar cell according to Comparative Example 2 comprises $TiO_2$, and, accordingly, $TiO_2$ elicits photocatalytic activity that results in modification and/or decomposition of chemical substances included in the organic semiconductor layer.

The reason for the slightly lower durability of the organic thin-film solar cell according to Example 1 compared to that of the organic thin-film solar cell according to Comparative Example 1 may be attributed to photocatalytic reactions elicited by $TiO_2$ that is present, in some amount, in the hole-blocking layer comprising substantially amorphous titanium oxide.

That is, the hole-blocking layer in the organic thin-film solar cell according to Example 1 was produced using an aqueous solution. As a result, a certain amount of water remained in the hole-blocking layer, even after the drying step. The hole-blocking layer in the organic thin-film solar cell according to Comparative Example 1-1, by contrast, was produced in accordance with a sol-gel method, and contained therefore substantially no water.

The hole-blocking layer produced in accordance with both methods is titanium oxide in an amorphous state at the macro level, but stoichiometric titanium oxide, i.e. $TiO_2$ may occur in small regions. That is, the hole-blocking layer contains a certain amount of $TiO_2$.

Water is indispensable for the progress of photocatalytic reactions by $TiO_2$. In the case of the organic thin-film solar cell according to Example 1, therefore, the $TiO_2$ contained in a certain amount in the hole-blocking layer elicited a photocatalytic effect on account of the presence also of a certain amount of water in the hole-blocking layer. As a result, part of the organic semiconductor layer that was in contact with the hole-blocking layer might become inactivated.

The drop in photoelectric conversion efficiency in the organic thin-film solar cell according to Example 1, however, was small, of 10%, as shown in Table 3 and FIG. 3. Also, the photoelectric conversion efficiency was higher than that of the organic thin-film solar cell according to Comparative Example 1-1, even after a lapse of 10 hours. Further considering that the organic thin-film solar cell according to Example 1 can be easily produced in the atmosphere, an overall evaluation indicates that the organic thin-film solar cell according to Example 1 is superior to the organic thin-film solar cell according to Comparative Example 1-1.

Example 3

An aqueous solution was prepared that contained 0.03 mol/L of hydrogen peroxide ($H_2O_2$) and 0.03 mol/L of titanium (IV) oxysulfate ($TiOSO_4$).

There was prepared a non-polished glass substrate with ITO film (by Kuramoto Seisakusho) resulting from overlaying an ITO film, by sputtering, onto one of the surfaces of a glass substrate (25 mm×40 mm, thickness 0.45 mm). The thickness was 300 to 360 nm, and the sheet resistance of the ITO film was 4.5 Ω/square.

The face of the glass substrate on the side opposite to the face on which the ITO film was formed was covered with a polyimide film, and the whole glass substrate was then boil-washed in 2-propanol.

The glass substrate after washing, having the ITO film formed on one face thereof, and the other face covered by the polyimide film, was immersed for 5 minutes in the aqueous solution the temperature of which the bath temperature was kept at 80° C. using an oil bath.

The glass substrate was removed from the aqueous solution, and the removed glass substrate was then left to stand for 1 hour in an atmosphere at 150 to 300° C., to thereby form a 30 nm-thick amorphous titanium oxide layer on the ITO film of the glass substrate.

There was prepared a chlorobenzene solution in which P3HT (polythiophene derivative, by Rieke Metal) and a fullerene derivative (PCBM by Aldrich) were mixed at a mass ratio 5:3.

The chlorobenzene solution was spin-coated (700 rpm, 60 s) onto the amorphous titanium oxide layer, and the whole was dried for about 10 minutes, at room temperature, to form a 250-nm organic semiconductor layer.

There was prepared a nonionic surfactant (by Aldrich) containing 1 percent by weight of polyoxyethylene tridecyl ether ($C_{13}H_{27}(OCH_2CH_2)_nOH$, n=12) and 1 percent by weight of xylene, and having water and isopropanol as solvents, and 0.5 parts by weight of this nonionic surfactant were mixed with 100 parts by weight of a 1.3 percent by weight PEDOT:PSS aqueous dispersion (by Aldrich), to prepare a PTE-containing PEDOT:PSS aqueous dispersion.

The above-described PTE-containing PEDOT:PSS aqueous dispersion was heated at 50 to 90° C., and was spin-coated (6000 rpm, 60 s) onto the organic semiconductor layer. Natural drying was performed at room temperature, to thereby form a 80-nm hole-transport layer.

Next, an Au electrode layer (collector electrode layer) was vacuum vapor-deposited, to a film thickness of about 100 nm, onto the hole-transport layer. Specifically, a shadow mask having an opening corresponding to an 0.5 cm² electrode shape, plus the glass substrate up to the stage of having the hole-transport layer formed thereon, were placed in a chamber, and the interior of the chamber was evacuated using a rotary pump and a turbomolecular pump, to bring the pressure inside the chamber to $2\times10^{-3}$ Pa or less. A gold wire in the chamber was resistively heated, to form 100 nm of gold on the hole-transport layer, via the shadow mask. The film formation rate was set to 10 to 15 nm/min, and the pressure during film formation was set to $1\times10^{-2}$ Pa or less.

Thereafter, the glass substrate having formed on one face thereof, in accordance with the above-described production method, the ITO film, the hole-blocking layer, the organic semiconductor layer, the hole-transport layer and the gold film as the collector electrode layer, was subjected to a heating treatment for 5 minutes at 150° C., and was further held at 70° C. for 1 hour.

As a result of the above-described steps, there was produced an organic thin-film solar cell having a photoelectric conversion surface area of about 0.5 cm², specifically of 0.44 to 0.48 cm².

The organic thin-film solar cell produced according to the above-described production method was evaluated as follows.

Current-Voltage Characteristics

Light from a metal halide lamp having a light intensity of 150 mW/cm² was irradiated onto the organic thin-film solar cell panel, from the side of the ITO electrode layer. The photocurrent-voltage profile of the organic thin-film solar cell was measured, in this state, using a semiconductor characteristics evaluation system (4200-SCS, by Keithley Instruments).

The short-circuit current ($J_{sc}$/mA cm$^{-2}$), open circuit voltage ($V_{oc}$/V), fill factor (FF), maximum output ($P_{max}$/mW cm$^{-2}$) and energy conversion efficiency (θ/%) were calculated on the basis of this profile.

The results are given in Table 4.

TABLE 4

| Drying temperature/ °C. | $P_{max}$/ mW cm$^{-2}$ | F.F. | $V_{OC}$/V | $J_{SC}$/mA cm$^{-2}$ | η/% | Time for $P_{max}$/ min. |
| --- | --- | --- | --- | --- | --- | --- |
| 150 | 4.29 | 0.6 | 0.575 | 12.3 | 2.83 | 60 |
| 200 | 4.76 | 0.59 | 0.58 | 13.8 | 3.15 | 60 |
| 250 | 5.21 | 0.59 | 0.575 | 15.3 | 3.46 | 60 |
| 300 | 5.66 | 0.6 | 0.575 | 16.4 | 3.77 | 60 |

Example 4

A 200 mm×200 mm solar cell module was produced by arranging, in accordance with the method described below, a plurality of the organic thin-film solar cells produced in Example 1.

There was prepared a glass substrate with ITO film (by Kuramoto Seisakusho) resulting from overlaying an ITO film patterned by sputtering on one of the surfaces of a glass substrate (200 mm×200 mm, thickness 0.5 mm). The sheet resistance of ITO was 4.5 Ω/square.

An amorphous titanium oxide layer, an organic semiconductor layer, and a hole-transport layer were formed over the entire surface of this substrate in accordance with the same cleaning and film formation methods of Example 1. The amount of the solution used was increased according to the increased surface area of the substrate in this case, and the specifications of the equipment were matched to the surface area of the substrate. The Au electrode layer was patterned by vacuum vapor deposition, using a shadow mask similar to in the method of Example 1. As a result of the above-described steps, there was produced a solar cell on a 20 cm×20 cm substrate having 20 elements each having a photoelectric conversion surface area of 10 mm×70 mm, namely, 7 cm$^2$ (total light conversion surface area was 140 cm$^2$).

The solar cell thus obtained exhibited an open circuit voltage of 2.0 V and a short-circuit current of 13 mA upon irradiation of 10 mW/cm$^2$ of sunlight, such that a motor (RF-330TK, by Narika Corporation) could stably operate.

Example 5

There was prepared a PET substrate with ITO film resulting from overlaying, by sputtering, an ITO film onto one of the surfaces of a PET substrate (22 mm×38 mm, thickness 125 μm). The sheet resistance of the ITO film that constituted the light-transmitting electrode layer was 30 Ω/square.

Tetraisopropyl titanate (by Aldrich) in an amount of 1.85 mL was injected, using a syringe, into a 100 mL three-necked flask with nitrogen gas stream and charged beforehand with 12.5 mL of dehydrated 2-methoxyethanol (by Aldrich). The flask was cooled for 10 minutes in an ice-water bath.

The 2-methoxyethanol solution in the flask was then heated for 1 hour at 80° C. in a nitrogen atmosphere, and was further refluxed for 2 hours. The solution after heating was left to cool for 10 minutes, followed by cooling the flask for 30 minutes in an ice-water bath. Then, 0.65 mL of diethylamine (by Aldrich) was dripped slowly onto the solution in the flask, using a syringe, while under stirring of the 2-methoxyethanol in the flask. After dropping, the 2-methoxyethanol solution was stirred for 10 minutes while under cooling in an ice-water bath, in a nitrogen atmosphere. The 2-methoxyethanol solution in the flask was then heated for 1 hour at 80° C. in a nitrogen atmosphere, and was further refluxed for 2 hours. The solution after heating was left to cool for 10 minutes, followed by cooling the flask for 30 minutes in an ice-water bath.

Then, 0.3 mL of this 2-methoxyethanol solution were diluted with 1 mL of dehydrated 2-propanol (organic synthesis reagent, by Kanto Chemical), to yield a nonaqueous solution for forming an oxide semiconductor layer that forms a hole-blocking layer.

About 0.3 mL of the nonaqueous solution prepared in accordance with the above-described procedure were dripped onto the ITO substrate, with spin-coating for at 2000 rpm for 1 minute.

The ITO substrate on the surface of which a nonaqueous solution layer had formed was left to stand for 30 minutes in an atmosphere at room temperature (25° C.) and relative humidity 45%, to elicit hydrolysis.

After 30 minutes, the ITO substrate was dried for 50 minutes on a hot plate set to 100° C., to volatilize the solvent and so forth thereby.

As a result, there was obtained an oxide semiconductor layer that constituted a 40 nm-thick hole-blocking layer.

Thereafter, the same production method as in Example 1 was applied so as to produce a flexible organic thin-film solar cell having a photoelectric conversion surface area of 1 cm$^2$.

The current-voltage characteristics of this organic thin-film solar cell were evaluated in the same way as in Example 1. The results are given in Table 5.

TABLE 5

| | $J_{SC}$/mA cm$^{-2}$ | $V_{OC}$/V | FF | η/% |
| --- | --- | --- | --- | --- |
| Example 5 | 5.7 | 0.58 | 0.52 | 1.74 |

Example 6

In a glovebox filled with nitrogen (oxygen concentration was 1 ppm or less, water concentration was 1 ppm or less), 6.25 mL of dehydrated 2-methoxyethanol (by Aldrich) were measured and put in a gas vial tube having a capacity of 15 mL, at room temperature, and 0.925 mL of tetraisopropyl titanate (by Aldrich) were then measured and poured onto the solvent, with stirring. 0.325 mL of diethylamine (by Aldrich) were measured and poured onto the resulting solution. The solution was stoppered hermetically, and was left to stand for about 2 weeks in the glovebox.

Thereafter, an organic thin-film solar cell having a hole-blocking layer was produced according to the same operation as in Example 5, but herein the ITO film formed on glass described in Example 1 was used as the ITO substrate. In this case, organic thin-film solar cells were produced by varying the molar ratio of tetraisopropyl titanate (by Aldrich) with respect to dimethylamine (by Aldrich) (tetraisopropyl titanate/dimethylamine, hereafter "T/D ratio") in the nonaqueous solution that formed the hole-blocking layer.

The current-voltage characteristics of the organic thin-film solar cells were evaluated in the same way as in Example 1. The results are given in Table 6.

TABLE 6

| | T/D ratio | $J_{SC}$/mA cm$^{-2}$ | $V_{OC}$/V | FF | η/% |
| --- | --- | --- | --- | --- | --- |
| Example 6-1 | 1 | 7.44 | 0.57 | 0.47 | 1.99 |
| Example 6-2 | 0.5 | 7.41 | 0.58 | 0.52 | 2.21 |
| Example 6-3 | 0.25 | 7.19 | 0.57 | 0.47 | 1.92 |

Example 7

An explanation follows next on the results of the assessment on repetition stability of the hole-blocking layer according to the present invention.

(1) Production of an Organic Thin-Film Solar Cell

An aqueous solution was prepared that contained 0.03 mol/L of hydrogen peroxide ($H_2O_2$) and 0.03 mol/L of titanium (IV) oxysulfate ($TiOSO_4$) (hereafter, "aqueous solution" for short).

There was prepared a glass substrate with ITO film (by Kuramoto Seisakusho) resulting from overlaying an ITO film, by sputtering, onto one of the surfaces of a glass substrate (2.5 mm×4 mm, thickness 0.5 mm). The thickness was 300 to 360 nm, and the sheet resistance of the ITO film was 4.5 Ω/square.

The face of the glass substrate on the side opposite to that on which the ITO film was formed was covered with a polyimide film, and the whole glass substrate was then boil-washed in 2-propanol.

A glass substrate after boil-washing was immersed in a 50 mL sample vial that held 50 mL of the aqueous solution at room temperature. The sample vial was placed on a hot plate heated at 125° C., to heat thereby the aqueous solution in the vial. The aqueous solution became turbid after about 20 minutes. The temperature of the aqueous solution at this time was 60 to 70° C. The aqueous solution was held for 5 minutes in this state, and thereafter the glass substrate was removed from the sample vial, and the glass substrate was then immersed in a beaker that held ultrapure water, followed by cleaning for 10 minutes under application of ultrasonic impacts to the beaker. The glass substrate after cleaning was removed, and the water remaining on the substrate surface was removed by argon gas blowing. The substrate after blowing was placed on a hot plate heated at 150° C., and the substrate was then heated for 60 minutes. A member was obtained thus that had a 50-nm amorphous titanium oxide layer on an ITO film on a glass substrate.

Thereafter, the production method described in Example 3 was applied to this member, to produce an organic thin-film solar cell having a photoelectric conversion surface area of 0.5 cm².

(2) Evaluation

The current-voltage characteristics of 41 organic thin-film solar cell panels produced in accordance with the above-described production method were evaluated in the same way as in Example 3. The short-circuit current (absolute value, $J_{sc}$/mA cm$^{-2}$), open circuit voltage ($V_{oc}$/V), fill factor (FF), and energy conversion efficiency (η/%) were calculated.

(3) Results

The obtained results are given in Table 7.

TABLE 7

|  | η [%] | Pmax [mW/cm²] | $J_{SC}$ [mA/cm²] | $V_{OC}$ [V] | FF |
|---|---|---|---|---|---|
| Mean | 3.09 | 4.63 | −13.53 | 0.572 | 0.60 |
| σ | 0.20 | 0.32 | 0.80 | 0.005 | 0.02 |

As Table 7 shows, employing a method for producing a hole-blocking layer according to the present invention allows obtaining organic thin-film solar cells having particularly small variability in characteristics.

Example 8

An explanation follows next on the results upon assessment on the stability of the method for producing a hole-blocking layer according to the present invention.

(1) Production of an Organic Thin-Film Solar Cell

An aqueous solution was prepared that contained 0.03 mol/L of hydrogen peroxide ($H_2O_2$) and 0.023 mol/L of titanium (IV) oxysulfate ($TiOSO_4$) (hereafter, "aqueous solution" for short).

There were prepared twelve glass substrates measuring 20 cm×20 cm and having a thickness of 0.5 mm. There were prepared twelve glass substrates with ITO film (by Kuramoto Seisakusho) resulting from overlaying an ITO film, by sputtering, onto one of the surfaces of a glass substrate measuring 2.5 mm×4 mm and having a thickness of 0.5 mm. The thickness was 300 to 360 nm, and the sheet resistance of the ITO film was 4.5 W square.

The above-described twelve 20 cm×20 cm glass substrates and twelve 2.5 cm×4 cm glass substrates with ITO film were boil-washed in 2-propanol.

Five boil-washed 2.5 cm×4 cm glass substrates with ITO film were fixed to five sites, at the center and near the corners, of one boil-washed 20 cm×20 cm glass substrate. The other seven boil-washed 2.5 cm×4 cm glass substrates with ITO film were respectively fixed to one site, namely a central portion, of seven boil-washed 20 cm×20 cm glass substrates.

Figure 4:
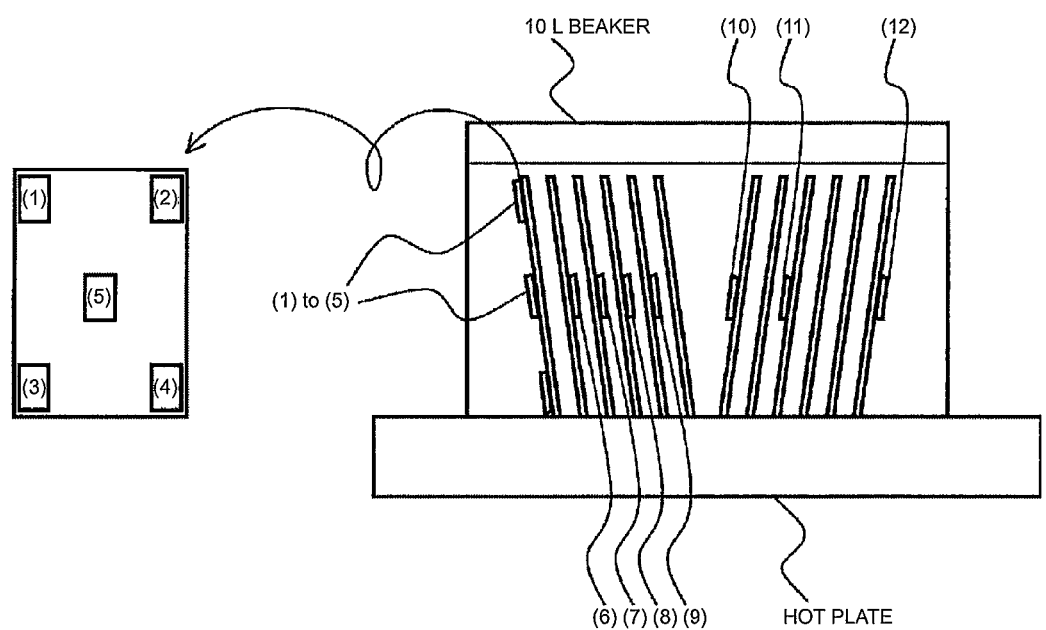
FIG. 4 is a diagram conceptually illustrating the configuration of glass substrates and the arrangement thereof in a beaker of Example 8.

Twelve 20 cm×20 cm glass substrates including seven glass substrates having fixed thereon the twelve 2.5 cm×4 cm glass substrates with ITO film, as described above, were disposed and immersed in a 10 L beaker containing 8 L of the aqueous solution at room temperature, as illustrated in FIG. 4. The beaker with the glass substrates immersed therein was covered with aluminum foil, and was placed on a hot plate heated at 250° C., to heat thereby the aqueous solution in the beaker. The aqueous solution became turbid after about 35 minutes. The temperature of the aqueous solution at this time was 60 to 70° C. This state was held for 5 minutes, and thereafter the twelve 2.5 cm×4 cm glass substrates with ITO film were removed from the beaker, were then immersed in a beaker that held ultrapure water, followed by cleaning for 10 minutes under application of ultrasonic impacts to the beaker. The glass substrates after cleaning were removed, and the water remaining on the substrate surface was removed by argon gas blowing. The substrates after blowing were placed on a hot plate heated at 150° C., and the substrates were then heated for 60 minutes. Twelve members were obtained thus that had a 50 nm amorphous titanium oxide layer on an ITO film on the 2.5 cm×4 cm glass substrates.

Thereafter, the production method described in Example 3 was applied to these members, to produce twelve organic thin-film solar cells having each a photoelectric conversion surface area of 0.5 cm².

(2) Evaluation

The current-voltage characteristics of twelve organic thin-film solar cell panels produced in accordance with the above-described production method were evaluated in the same way as in Example 3. The short-circuit current (absolute value, $J_{sc}$/mA cm$^{-2}$), open circuit voltage ($V_{oc}$/V), fill factor (FF), and energy conversion efficiency (η/%) were calculated.

(3) Results

The obtained results are given in Table 8.

TABLE 8

| Substrate arrangement | η [%] | Pmax [mW/cm²] | $J_{SC}$ [mA/cm²] | $V_{OC}$ [V] | FF |
|---|---|---|---|---|---|
| (1) | 2.94 | 4.42 | −12.97 | 0.570 | 0.60 |
| (2) | 3.09 | 4.64 | −13.71 | 0.575 | 0.59 |
| (3) | 2.68 | 4.02 | −12.54 | 0.575 | 0.56 |
| (4) | 3.11 | 4.67 | −13.50 | 0.575 | 0.60 |

TABLE 8-continued

| Substrate arrangement | η [%] | Pmax [mW/cm$^2$] | J$_{SC}$ [mA/cm$^2$] | V$_{OC}$ [V] | FF |
|---|---|---|---|---|---|
| (5) | 2.87 | 4.30 | −13.05 | 0.580 | 0.57 |
| (6) | 3.13 | 4.69 | −13.56 | 0.570 | 0.61 |
| (7) | 2.95 | 4.42 | −12.58 | 0.575 | 0.61 |
| (8) | 3.01 | 4.51 | −13.43 | 0.570 | 0.59 |
| (9) | 2.87 | 4.30 | −12.80 | 0.570 | 0.59 |
| (10) | 3.05 | 4.57 | −13.27 | 0.570 | 0.60 |
| (11) | 3.13 | 4.69 | −13.74 | 0.565 | 0.60 |
| (12) | 2.77 | 4.16 | −13.05 | 0.565 | 0.56 |

The above-described results show that organic thin-film solar cells having small variability in characteristics within a batch can be obtained by employing the method for producing a hole-blocking layer according to the present invention.

The invention claimed is:

1. A hole-blocking layer disposed between an organic semiconductor layer and an electrode electrically connected to the organic semiconductor in an element comprising the organic semiconductor layer and the electrode, the hole-blocking layer suppressing electrical conduction between the organic semiconductor layer and the electrode from being carried by holes,
wherein the hole-blocking layer is produced by a process that has a step of bringing an aqueous solution containing hydrogen peroxide and titanium (IV) oxysulfate into contact with the surface of a member on which the hole-blocking layer is to be formed, and holding the contact between the aqueous solution and the surface of the member at 50 to 120° C., so that an amorphous titanium oxide precursor precipitates on the surface of the member; and a step of drying the amorphous titanium oxide precursor that has precipitated on the surface of the member,
wherein the method does not comprise electroreductive precipitation.

2. The hole-blocking layer according to claim 1, wherein the aqueous solution contains 0.005 mol/L to 1 mol/L of the titanium (IV) oxysulfate and 0.005 mol/L to 1 mol/L of the hydrogen peroxide.

3. The hole-blocking layer according to claim 1, wherein the hole-blocking layer has a surface roughness (Ra) equal to or smaller than a surface roughness of the member on which the hole-blocking layer is to be formed.

4. A hole-blocking layer disposed between an organic semiconductor layer and an electrode electrically connected to the organic semiconductor in an element comprising the organic semiconductor layer and the electrode, the hole-blocking layer suppressing electrical conduction between the organic semiconductor layer and the electrode from being carried by holes,
wherein the hole-blocking layer is produced by a process that has a step of bringing a nonaqueous solution containing a diethylamine and an organic titanium compound represented by formula (i) below, into contact with the surface of a member on which the hole-blocking layer is to be formed, to thereby form a liquid layer of the nonaqueous solution on the surface; a step of hydrolyzing the organic titanium compound included in the liquid layer of the nonaqueous solution, to thereby form a hydrolysis product of the organic titanium compound in the liquid layer of the nonaqueous solution; and a step of drying the liquid layer of the nonaqueous solution containing the hydrolysis product of the organic titanium compound:

   (i)

wherein R$^1$ denotes identical or different substituents selected from the group consisting of alkyl groups having from 1 to 8 carbon atoms, cycloalkyl groups, and aryl groups, as well as hydroxy, alkoxy, amino, and fluoro derivatives of alkyl groups having from 1 to 8 carbon atoms, cycloalkyl groups, and aryl groups.

5. The hole-blocking layer according to claim 4, wherein the molar ratio of the organic titanium compound with respect to the diethylamine in the nonaqueous solution for forming the hole-blocking layer (the organic titanium compound/diethylamine) ranges from 0.25 to 1.

6. The hole-blocking layer according to claim 4, wherein a drying temperature in the step of drying the nonaqueous solution located on the member and containing the hydrolysis product of the organic titanium compound is not higher than 100° C.

7. A photoelectric conversion element, comprising a stack in which there are disposed a first collector electrode layer, the hole-blocking layer described in claim 1, an organic semiconductor layer, and a second collector electrode layer in this order,
wherein at least one of the first collector electrode layer and the second collector electrode layer has light transmissivity.

8. The photoelectric conversion element according to claim 7, wherein the thickness of the hole-blocking layer ranges from 5 nm to 200 nm.

9. The photoelectric conversion element according to claim 7, wherein a hole-transport layer that promotes charge transfer between the organic semiconductor layer and the second collector electrode layer being carried by holes is provided between the organic semiconductor layer and the second collector electrode layer.

10. The photoelectric conversion element according to claim 9,
wherein the organic semiconductor layer includes a conjugated polymer as an electron donor and a fullerene derivative as an electron acceptor, and
the hole-transport layer is produced by a process that has a step of bringing a surface of the organic semiconductor layer included in a member resulting from stacking the first collector electrode layer, the hole-blocking layer, and the organic semiconductor layer, into contact with an aqueous dispersion containing poly-3,4-ethylenedioxythiophene (PEDOT) and polystyrene sulfonate (PSS), and a nonionic surfactant.

11. The photoelectric conversion element according to claim 10, wherein the nonionic surfactant is represented by formula (ii) below:

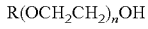   (ii)

wherein R denotes an alkyl group having from 10 to 15 carbon atoms, and n is an integer ranging from 5 to 15.

12. An organic thin-film solar cell panel, comprising:
a light-transmitting substrate;
the photoelectric conversion element described in claim 7 provided on the light-transmitting substrate in such a manner that the first or second collector electrode layer having light transmissivity is in contact with the light-transmitting substrate; and
a chassis that seals the photoelectric conversion element.

13. A light-emitting device, comprising the photoelectric conversion element described in claim 7, as a light-emitting element.

14. A method for producing a hole-blocking layer disposed between an organic semiconductor layer and an electrode electrically connected to the organic semiconductor in an element comprising the organic semiconductor layer and the electrode, the hole-blocking layer suppressing electrical conduction between the organic semiconductor layer and the electrode from being carried by holes, the method comprising:
- a step of bringing an aqueous solution containing hydrogen peroxide and titanium (IV) oxysulfate into contact with the surface of a member on which the hole-blocking layer is to be formed, and holding the contact between the aqueous solution and the surface of the member at 50 to 120° C., so that an amorphous titanium oxide precursor precipitates on the surface of the member; and
- a step of drying the amorphous titanium oxide precursor that has precipitated on the member,
- wherein the method does not comprise electroreductive precipitation.

15. The method according to claim 14, wherein the aqueous solution contains 0.005 mol/L to 1 mol/L of the titanium (IV) oxysulfate and 0.005 mol/L to 1 mol/L of the hydrogen peroxide.

16. The method according to claim 14, wherein the hole-blocking layer has a surface roughness (Ra) equal to or smaller than a surface roughness of the member on which the hole-blocking layer is to be formed.

17. A method for producing a hole-blocking layer disposed between an organic semiconductor layer and an electrode electrically connected to the organic semiconductor in an element comprising the organic semiconductor layer and the electrode, the hole-blocking layer suppressing electrical conduction between the organic semiconductor layer and the electrode from being carried by holes, the method comprising:
- a step of bringing a nonaqueous solution containing a diethylamine and an organic titanium compound represented by formula (i) below, into contact with the surface of a member on which the hole-blocking layer is to be formed, to thereby form a liquid layer of the nonaqueous solution on the surface; a step of hydrolyzing the organic titanium compound included in the liquid layer of the nonaqueous solution, to thereby form a hydrolysis product of the organic titanium compound in the liquid layer of the nonaqueous solution; and a step of drying the liquid layer of the nonaqueous solution containing the hydrolysis product of the organic titanium compound:

$$Ti(OR^1)_4 \quad (i)$$

wherein $R^1$ denotes identical or different substituents selected from the group consisting of alkyl groups having from 1 to 8 carbon atoms, cycloalkyl groups, and aryl groups, as well as hydroxy, alkoxy, amino, and fluoro derivatives of alkyl groups having from 1 to 8 carbon atoms, cycloalkyl groups, and aryl groups.

18. The method according to claim 17, wherein the molar ratio of the organic titanium compound with respect to the diethylamine in the nonaqueous solution for forming the hole-blocking layer (the organic titanium compound/diethylamine) ranges from 0.25 to 1.

19. The method according to claim 17, wherein a drying temperature in the step of drying the nonaqueous solution located on the member and containing the hydrolysis product of the organic titanium compound is not higher than 100° C.

20. A method for producing a photoelectric conversion element comprising a stack in which there are disposed a first collector electrode layer, an oxide semiconductor layer, an organic semiconductor layer, a hole-transport layer, and a second collector electrode layer in this order,
- wherein at least one of the first collector electrode layer and the second collector electrode layer has light transmissivity,
- the oxide semiconductor layer comprises a hole-blocking layer produced in accordance with the production method described in claim 14,
- the organic semiconductor layer includes a conjugated polymer as an electron donor and a fullerene derivative as an electron acceptor, and
- the hole-transport layer is produced by a process that has a step of bringing a surface of the organic semiconductor layer included in a member resulting from stacking the first collector electrode layer, the oxide semiconductor layer, and the organic semiconductor layer, into contact with an aqueous dispersion containing poly-3,4-ethylenedioxythiophene (PEDOT) and polystyrene sulfonate (PSS), and a nonionic surfactant.

21. The method according to claim 20, wherein the nonionic surfactant is represented by formula (ii) below:

$$R(OCH_2CH_2)_nOH \quad (ii)$$

wherein R denotes an alkyl group having from 10 to 15 carbon atoms, and n is an integer ranging from 5 to 15.

22. A method for producing a photoelectric conversion element comprising a stack in which there are disposed a first collector electrode layer, an oxide semiconductor layer, an organic semiconductor layer, a hole-transport layer, and a second collector electrode layer in this order,
- wherein at least one of the first collector electrode layer and the second collector electrode layer has light transmissivity,
- the oxide semiconductor layer comprises a hole-blocking layer produced in accordance with the production method described in claim 17,
- the organic semiconductor layer includes a conjugated polymer as an electron donor and a fullerene derivative as an electron acceptor, and
- the hole-transport layer is produced by a process that has a step of bringing a surface of the organic semiconductor layer included in a member resulting from stacking the first collector electrode layer, the oxide semiconductor layer, and the organic semiconductor layer, into contact with an aqueous dispersion containing poly-3,4-ethylenedioxythiophene (PEDOT) and polystyrene sulfonate (PSS), and a nonionic surfactant.

* * * * *

UNITED STATES PATENT AND TRADEMARK OFFICE
CERTIFICATE OF CORRECTION

PATENT NO. : 9,293,721 B2
APPLICATION NO. : 13/389838
DATED : March 22, 2016
INVENTOR(S) : Yasuhiko Kasama et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 939 days.

Signed and Sealed this
Fifth Day of July, 2016

Michelle K. Lee
*Director of the United States Patent and Trademark Office*